(12) United States Patent
Huang et al.

(10) Patent No.: US 12,456,422 B2
(45) Date of Patent: Oct. 28, 2025

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Jianchang Cai, Beijing (CN); Yue Long, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/018,876

(22) PCT Filed: Jan. 10, 2022

(86) PCT No.: PCT/CN2022/071125
§ 371 (c)(1),
(2) Date: Jan. 31, 2023

(87) PCT Pub. No.: WO2022/174692
PCT Pub. Date: Aug. 25, 2022

(65) Prior Publication Data
US 2023/0306904 A1  Sep. 28, 2023

(30) Foreign Application Priority Data

Feb. 20, 2021  (WO) ............... PCT/CN2021/077084

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC .............. G06K 9/0004; G06V 40/1318; H01L 27/3227; H01L 27/3234; H10K 59/60; H10K 59/65
See application file for complete search history.

(56) References Cited

U.S. PATENT DOCUMENTS 10,147,777 B2    12/2018  Lim et al.
10,936,842 B2     3/2021  Gao et al.
(Continued)

FOREIGN PATENT DOCUMENTS

CN    107731144 A    2/2018
CN    108597374 A    9/2018
(Continued)

OTHER PUBLICATIONS

International Search Report and Written Opinion issued Nov. 2, 2021, in corresponding International Application No. PCT/CN2021/077084, 20pp.
(Continued)

*Primary Examiner* — Yuzhen Shen
(74) *Attorney, Agent, or Firm* — XSENSUS LLP

(57) ABSTRACT

Provided is a display panel. The display panel includes: a base substrate; a plurality of pixel units disposed on the base substrate, wherein the pixel unit includes a pixel circuit and a light-emitting element; a constant voltage line, configured to provide a constant voltage to the pixel circuit; and a plurality of shield electrodes, wherein at least one of the plurality of shield electrodes corresponds to at least one pixel circuit, an orthographic projection of the at least one of the plurality of shield electrodes on the base substrate is at
(Continued)

least partially overlapped with an orthographic projection of the corresponding at least one pixel circuit on the base substrate, at least part of the plurality of shield electrodes are connected, and the at least part of the plurality of shield electrodes are electrically connected to the constant voltage line.

18 Claims, 9 Drawing Sheets

(51) Int. Cl.
    *H10K 59/126* (2023.01)
    *H10K 59/131* (2023.01)
    *H10K 59/65* (2023.01)
(52) U.S. Cl.
    CPC ... *H10K 59/126* (2023.02); *G09G 2300/0408* (2013.01); *G09G 2300/0819* (2013.01); *G09G 2300/0842* (2013.01); *G09G 2300/0861* (2013.01); *G09G 2310/0202* (2013.01); *G09G 2310/08* (2013.01); *H10K 59/131* (2023.02); *H10K 59/65* (2023.02)

(56) References Cited

U.S. PATENT DOCUMENTS

| | | | |
|---|---|---|---|
| 10,991,774 | B2 | 4/2021 | Sung et al. |
| 11,264,443 | B2 | 3/2022 | Wang |
| 11,373,599 | B1 | 6/2022 | Chen |
| 11,380,263 | B2 | 7/2022 | Yoon et al. |
| 11,682,353 | B2 | 6/2023 | Yoon et al. |
| 2008/0062373 | A1 | 3/2008 | Kim et al. |
| 2008/0204619 | A1 | 8/2008 | Saitou et al. |
| 2016/0043159 | A1 | 2/2016 | Kim et al. |
| 2016/0329392 | A1 | 11/2016 | Miyake |
| 2018/0047799 | A1 | 2/2018 | Lim et al. |
| 2018/0114824 | A1* | 4/2018 | Lee .............. H10K 59/131 |
| 2018/0331124 | A1 | 11/2018 | Cho et al. |
| 2019/0252475 | A1 | 8/2019 | Sung et al. |
| 2019/0325186 | A1 | 10/2019 | Gao et al. |
| 2020/0144346 | A1 | 5/2020 | Lee et al. |
| 2020/0194529 | A1 | 6/2020 | Lee et al. |
| 2020/0380915 | A1 | 12/2020 | Yoon et al. |
| 2021/0012706 | A1 | 1/2021 | Yang |
| 2021/0143241 | A1* | 5/2021 | Kim .............. H10K 59/131 |
| 2021/0151540 | A1 | 5/2021 | Wang |
| 2021/0249488 | A1 | 8/2021 | Sung et al. |
| 2021/0272521 | A1 | 9/2021 | Yoon et al. |
| 2021/0296419 | A1 | 9/2021 | Xu et al. |
| 2021/0328000 | A1 | 10/2021 | Jia et al. |
| 2021/0359080 | A1* | 11/2021 | Xu .............. H10K 59/121 |
| 2022/0085133 | A1 | 3/2022 | Yuan et al. |
| 2022/0165827 | A1* | 5/2022 | Xu .............. H10K 59/1201 |
| 2022/0173185 | A1 | 6/2022 | Jin et al. |
| 2022/0181354 | A1* | 6/2022 | Lee .............. H10K 59/126 |
| 2022/0202421 | A1 | 6/2022 | Holsten et al. |
| 2022/0231093 | A1 | 7/2022 | Zhang et al. |
| 2022/0271114 | A1 | 8/2022 | Mn et al. |
| 2022/0310742 | A1 | 9/2022 | Yi et al. |
| 2022/0335895 | A1 | 10/2022 | Yoon et al. |
| 2022/0367587 | A1* | 11/2022 | Li .............. H10K 59/1213 |
| 2023/0026822 | A1 | 1/2023 | Wang et al. |
| 2023/0028604 | A1 | 1/2023 | Ma et al. |
| 2023/0083099 | A1 | 3/2023 | Xu et al. |

FOREIGN PATENT DOCUMENTS

| | | | |
|---|---|---|---|
| CN | 109697958 | A | 4/2019 |
| CN | 110114885 | A | 8/2019 |
| CN | 110299107 | A | 10/2019 |
| CN | 110299384 | A | 10/2019 |
| CN | 110335564 | A | 10/2019 |
| CN | 110767739 | A | 2/2020 |
| CN | 110992880 | A | 4/2020 |
| CN | 111162199 | A | 5/2020 |
| CN | 111293126 | A | 6/2020 |
| CN | 111564120 | A | 8/2020 |
| CN | 111833720 | A | 10/2020 |
| CN | 111834375 | A | 10/2020 |
| CN | 111834413 | A | 10/2020 |
| CN | 112038381 | A | 12/2020 |
| CN | 112103318 | A | 12/2020 |
| CN | 112271203 | A | 1/2021 |
| CN | 112750860 | A | 5/2021 |
| CN | 112885876 | A | 6/2021 |
| CN | 112951892 | A | 6/2021 |
| CN | 113013218 | A | 6/2021 |
| CN | 113053309 | A | 6/2021 |
| CN | 113299229 | A | 8/2021 |
| CN | 113451360 | A | 9/2021 |
| JP | 2019-139232 | A | 8/2019 |
| KR | 10-2020-0000513 | A | 1/2020 |

OTHER PUBLICATIONS

Extended European Search Report issued Jun. 6, 2023, in corresponding European Patent Application No. 21926138.5, 11pp.

Non-Final Office Action issued Aug. 7, 2023 in U.S. Appl. No. 17/610,527, 35 pages.

Final Office Action issued on Jan. 17, 2024, in corresponding U.S. Appl. No. 17/610,527, 33 pages.

Notice of allowance issued on Apr. 1, 2024, in corresponding U.S. Appl. No. 17/610,527, 24 pages.

* cited by examiner

DISPLAY PANEL AND DISPLAY DEVICE

CROSS-REFERENCE TO RELATED APPLICATIONS

This application is a U.S. national stage of international application No. PCT/CN2022/071125, filed on Jan. 10, 2022, which claims priority to PCT International Patent Application No. PCT/CN2021/077084, filed Feb. 20, 2021 and entitled "DISPLAY PANEL AND DISPLAY DEVICE", the disclosures of which are incorporated herein by references in their entireties.

TECHNICAL FIELD

The present disclosure relates to the field of display devices, and particularly relates to a display panel and a display device.

BACKGROUND OF THE INVENTION

Organic light-emitting diode (OLED) display panels are common display panels and are more and more widely applied in display devices such as mobile phones, tablet computers, digital cameras and the like, due to the advantages of self-luminance, wide viewing angle, high contrast, low power consumption, high response speed, and the like.

SUMMARY OF THE INVENTION

Embodiments of the present disclosure provide a display panel and a display device. The technical solutions are as follows.

According to some embodiments of the present disclosure, a display panel is provided. The display panel includes:
a base substrate;
a plurality of pixel units disposed on the base substrate, wherein the pixel unit includes a pixel circuit and a light-emitting element, the pixel circuit being configured to drive the light-emitting element;
a constant voltage line, configured to provide a constant voltage to the pixel circuit; and
a plurality of shield electrodes, wherein at least one of the plurality of shield electrodes corresponds to at least one pixel circuit, an orthographic projection of the at least one of the plurality of shield electrodes on the base substrate is at least partially overlapped with an orthographic projection of the corresponding at least one pixel circuit on the base substrate, at least part of the plurality of shield electrodes are connected, and the at least part of the plurality of shield electrodes which are connected are electrically connected to the constant voltage line.

In some embodiments, the plurality of shield electrodes include a plurality of groups of shield electrodes, wherein each group of the plurality of groups of shield electrodes is extended in a first direction, and the plurality of groups of shield electrodes are arranged in a second direction, the first direction intersecting the second direction, and both the first direction and the second direction being parallel to the base substrate.

In some embodiments, the at least part of the plurality of shield electrodes are connected by a connecting portion, wherein the connecting portion includes at least one of:
a first connecting portion connected between at least two of the plurality of shield electrodes that are arranged in the first direction;
a second connecting portion connected between at least two of the plurality of shield electrodes that are arranged in the second direction; and
a third connecting portion connected between at least two of the plurality of shield electrodes that are arranged in a third direction, the third direction intersecting the first direction and the second direction, and being parallel to the base substrate.

In some embodiments, the first direction is an extension direction of the constant voltage line.

In some embodiments, the base substrate is provided with a first display region and a second display region, the first display region being on at least one side of the second display region;
the pixel unit includes a first pixel unit and a second pixel unit, wherein
the first pixel unit is disposed in the first display region;
the pixel circuit of the second pixel unit is disposed in the first display region, the light-emitting element of the second pixel unit is disposed in the second display region, and the pixel circuit and the light-emitting element of the second pixel unit are connected by a conductive line; and
in a direction perpendicular to the base substrate, the shield electrode is disposed between the conductive line and the pixel circuit.

In some embodiments, the first display region includes a main display region and an auxiliary display region, wherein the main display region is on at least one side of the auxiliary display region, and the auxiliary display region is adjacent to the second display region; and
the pixel circuit of the second pixel unit is disposed in the auxiliary display region.

In some embodiments, the shield electrode connected to the constant voltage line is disposed in the main display region or the auxiliary display region.

In some embodiments, the display panel further includes: a first power line, a first initialization signal line and a reset control signal line;
wherein the pixel circuit includes a drive transistor, a first gate signal line, a second gate signal line, a first reset transistor, and a storage capacitor; wherein
a first electrode of the drive transistor is connected to the first power line, a gate of the drive transistor is connected to the first gate signal line, the first gate signal line is connected to the second gate signal line, the second gate signal line is connected to a second electrode of the first reset transistor, a first electrode of the first reset transistor is connected to the first initialization signal line, and a gate of the first reset transistor is connected to the reset control signal line; and
a first electrode of the storage capacitor is connected to the gate of the drive transistor, and a second electrode of the storage capacitor is connected to the first power line.

In some embodiments, in the second direction, the second electrodes of the storage capacitors of adjacent pixel circuits are connected with each other, at least two of the shield electrodes arranged in the second direction are connected by the second connecting portion, and an orthographic projection of the second connecting portion on the base substrate is at least partially overlapped with an orthographic projection of a connecting portion between the connected second electrodes on the base substrate; or
in the second direction, the second electrodes of the storage capacitors of adjacent pixel circuits are spaced apart.

In some embodiments, an orthographic projection of at least one of following structures on the base substrate is at least partially within an orthographic projection of the shield electrode on the base substrate:
the gate of the drive transistor;
the first gate signal line;
the second gate signal line;
the second electrode of the first reset transistor; and
a connecting portion between the second electrode of the storage capacitor and the first power line.

In some embodiments, the display panel further includes: a gate line and a data line; wherein the pixel circuit further includes a data writing transistor; wherein a gate of the data writing transistor is connected to the gate line, a first electrode of the data writing transistor is connected to the data line, and a second electrode of the data writing transistor is connected to the first electrode of the drive transistor.

In some embodiments, the pixel circuit further includes a threshold compensation transistor and a block; wherein a first electrode of the threshold compensation transistor is connected to the second electrode of the drive transistor, and a second electrode of the threshold compensation transistor is connected to the second gate signal line, and a gate of the threshold compensation transistor is connected to the gate line;
the threshold compensation transistor includes a first channel and a second channel, the first channel and the second channel being connected by a conductive connecting portion; and
the block is connected to the first power line, and an orthographic projection of the block on the base substrate is at least partially overlapped with an orthographic projection of the conductive connecting portion on the base substrate.

In some embodiments, the block is connected to the first power line through a second via hole, wherein an orthographic projection of the second via hole on the base substrate is at least partially within an orthographic projection of the shield electrode on the base substrate.

In some embodiments, the orthographic projection of the block on the base substrate is partially overlapped with an orthographic projection of the second gate signal line on the base substrate.

In some embodiments, the display panel further includes: a light-emitting control signal line, wherein the pixel circuit further includes a first light-emitting control transistor and a second light-emitting control transistor; wherein
a gate of the first light-emitting control transistor is connected to the light-emitting control signal line, a first electrode of the first light-emitting control transistor is connected to the first power line, and a second electrode of the first light-emitting control transistor is connected to the first electrode of the drive transistor; and
a gate of the second light-emitting control transistor is connected to the light-emitting control signal line, a first electrode of the second light-emitting control transistor is connected to the second electrode of the drive transistor, and a second electrode of the second light-emitting control transistor is connected to the light-emitting element.

In some embodiments, the display panel further includes: a second initialization signal line, wherein the pixel circuit further includes a second reset transistor; wherein a gate of the second reset transistor is connected to the reset control signal line, a first electrode of the second reset transistor is connected to the second initialization signal line, and a second electrode of the second reset transistor is connected to the second electrode of the second light-emitting control transistor.

In some embodiments, the constant voltage line includes the first power line or the first initialization signal line.

In some embodiments, the shield electrode includes an Al layer, a Mo layer, or an Al layer and a Ti layer that are alternately laminated.

According to some embodiments of the present disclosure, a display device is provided. The display device includes the display panel described above.

BRIEF DESCRIPTION OF DRAWINGS

For clearer descriptions of the technical solutions in the embodiments of the present disclosure, the following briefly describes the accompanying drawings required for describing the embodiments. The accompanying drawings in the following description show merely some embodiments of the present disclosure, and those of ordinary skill in the art may still derive other drawings from these accompanying drawings without creative effort.

DETAIL DESCRIPTION

To make the objectives, technical solutions, and advantages of the present disclosure clearer, the present disclosure will be further described in detail below with reference to the accompanying drawings.

Terms used in the embodiments of the present disclosure are only used to illustrate the embodiments of the present disclosure, but not intended to limit the present disclosure. Unless otherwise defined, the technical or scientific terms used in the embodiments of the present disclosure have the general meanings as usually understood by those of ordinary skill in the art to which the present disclosure pertains. "First", "second", "third", and similar words used in this specification and in the claims do not denote any order, quantity or importance, but are merely intended to distinguish between different constituents. Similarly, the terms "one", "a/an", and similar words are not meant to be limiting, but rather denote the presence of at least one. "Comprising", "including", and similar words mean that element or article appearing before "comprising" or "including" includes the elements or articles and their equivalent elements appearing behind "comprising" or "consisting", without excluding any other elements or articles. "Connected to", "connected with", and similar expressions are not restricted to physical or mechanical connections, but includes direct and indirect electrical connections. "Upper", "lower", "left", "right", and the like are only used to indicate a relative positional relationship, and when the absolute position of the described object is changed, the relative positional relationship is changed accordingly.

In a display device, a front camera occupies the space of a display panel, which reduces the screen-to-body ratio. In some display devices, the under-screen camera technology is adopted to arrange the camera under the display panel, so as to prevent the camera from affecting the screen-to-body ratio. The under-screen camera technology is a new technology for increasing the screen-to-body ratio of a display device.

Figure 1:
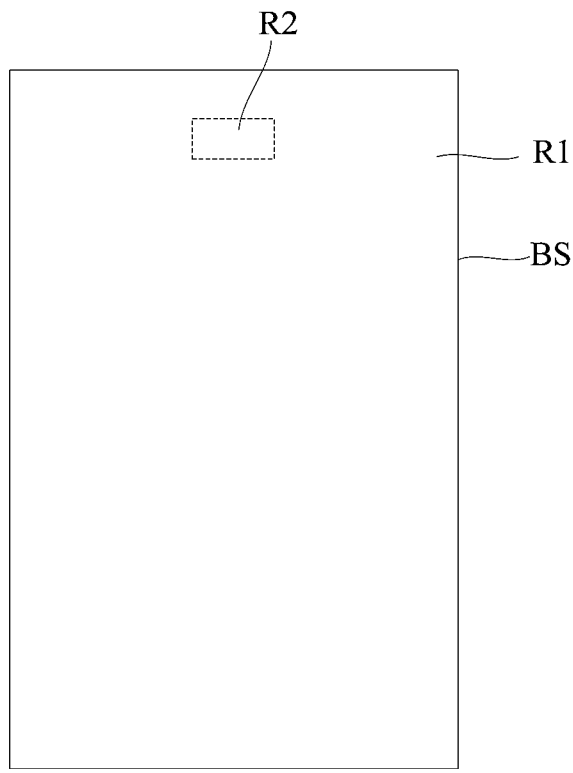
FIG. 1 is a schematic structural diagram of a display panel in the related art.

FIG. 1 is a schematic structural diagram of a display panel in the related art. As shown in FIG. 1, the display region of the display panel generally includes a first display region R1 and a second display region R2. The second display region R2 is a light-transmissive display region and corresponds to the under-screen camera. A light-emitting element and a pixel circuit are arranged in the first display region R1, while only the light-emitting element is arranged in the second display region R2, and no pixel circuit is arranged in the second display region R2. The pixel circuit configured to drive the light-emitting element arranged in the second display region R2 is arranged in the first display region R1, in order to reduce blocking of light by the pixel circuit and increase light transmission of the second display region R2, thereby improving the photographing effect of the under-screen camera.

The light-emitting element in the second display region R2 is connected to the pixel circuit in the first display region R1 by a conductive line, that is, the conductive line extends from the second display region R2 to the first display region R1. The conductive line and the pixel circuit in the first display region R1 are coupled to each other to form capacitance, which affects the display effect of a partial region of the display panel. In the related art, a shield electrode is provided in the display panel to isolate the pixel circuit from the conductive line, thereby reducing the influence on the display effect. However, when the shield electrode is provided, the shield electrode needs to be connected to a constant voltage line providing a constant voltage. However, the shield electrode is usually connected to the constant voltage line via a via hole. With many via holes being provided, not only the difficulty of manufacturing a display panel is increased, but also the region above the via holes is recessed, resulting in the structures in the region above the via holes to be uneven.

Figure 2:
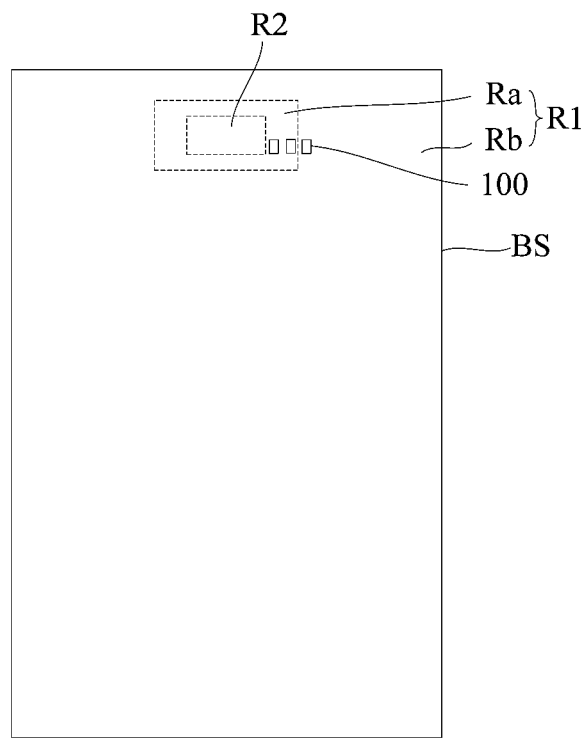
FIG. 2 is a schematic structural diagram of a display panel according to some embodiments of the present disclosure.

FIG. 2 is a schematic structural diagram of a display panel according to some embodiments of the present disclosure. As shown in FIG. 2, the display panel includes a base substrate BS and a plurality of pixel units 100. The pixel units 100 are disposed on the base substrate BS. FIG. 2 illustratively shows only three pixel units 100.

The base substrate BS is provided with a first display region R1 and a second display region R2. The first display region R1 is on at least one side of the second display region R2. For example, in some embodiments, the first display region R1 surrounds the second display region R2. That is, the second display region R2 is surrounded by the first display region R1.

The position of the second display region R2 is set based on demands. For example, in the embodiments of the present disclosure, the second display region R2 is in the middle at the top of the base substrate BS. In other embodiments, the second display region R2 also is on the left or on the right at the top of the base substrate BS.

The second display region R2 is a light-transmissive display region. In the display device, a photosensitive sensor, e.g., a camera, is arranged in correspondence to the second display region R2. The second display region R2 is light-transmissive to some extent such that the camera corresponding to the second display region R2 is capable of photographing normally and is also capable of displaying. The first display region R1 is configured to display.

Figure 3:
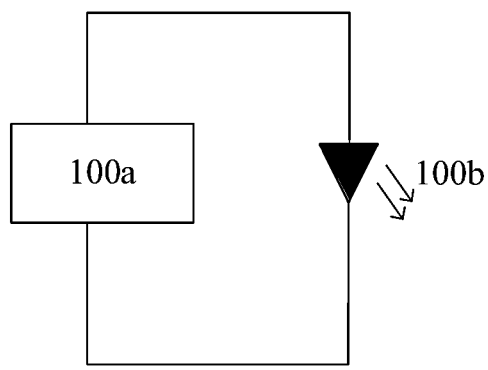
FIG. 3 is a schematic diagram of a pixel unit according to some embodiments of the present disclosure.

FIG. 3 is a schematic diagram of a pixel unit according to some embodiments of the present disclosure. As shown in FIG. 3, the pixel unit 100 includes a pixel circuit 100a and a light-emitting element 100b. The pixel circuit 100a is configured to drive the light-emitting element 100b. For example, the pixel circuit 100a is configured to provide a driving current to drive the light-emitting element 100b to emit light. Different light-emitting elements emit the same or different colors of light. Generally, the plurality of light-emitting elements 100b include a plurality of red light-emitting elements, a plurality of green light-emitting elements, and a plurality of blue light-emitting elements. Some display panels further include light-emitting elements that emit other colors of light, such as white light-emitting elements. The specific color of light emitted by the light-emitting element is set according to the display requirements of the display panel.

In order to increase the light transmittance of the second display region R2, only the light-emitting element is disposed in the second display region R2, and the pixel circuit driving the light-emitting element of the second display region R2 is disposed in the first display region R1. That is, the light-emitting element and the pixel circuit are arranged separately in order to increase the light transmittance of the second display region R2.

Figure 4:
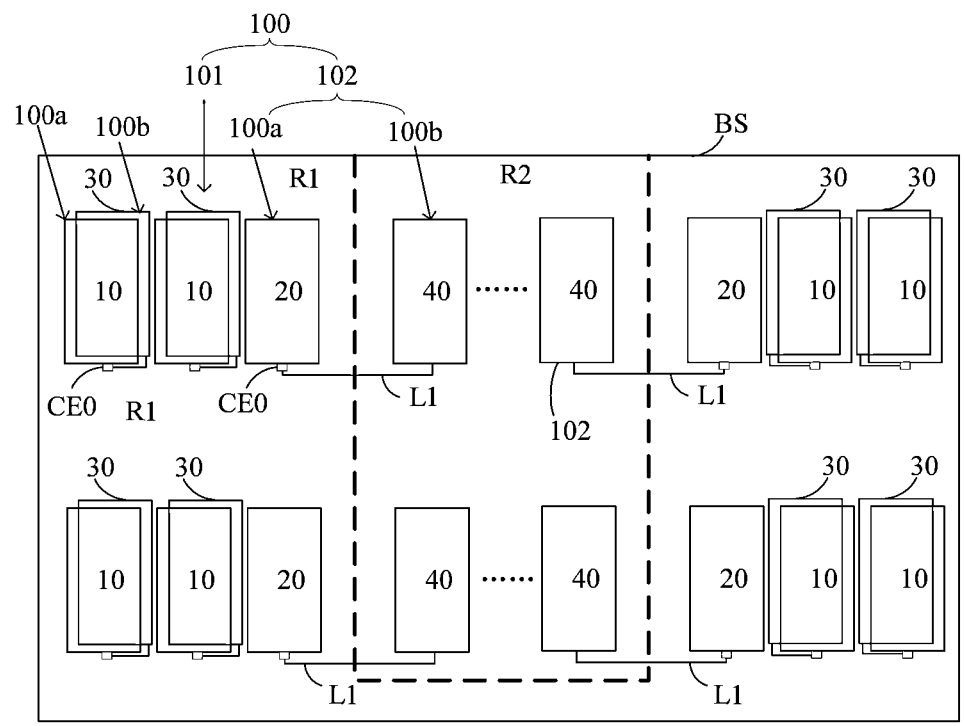
FIG. 4 is a schematic structural diagram of a display panel according to some embodiments of the present disclosure.

FIG. 4 is a schematic structural diagram of a display panel according to some embodiments of the present disclosure. As shown in FIG. 4, in the display panel, the pixel unit 100 includes a first pixel unit 101 and a second pixel unit 102. The light-emitting element and pixel circuit of the first pixel unit 101 are both disposed in the first display region R1; the pixel circuit 100a of the second pixel unit 102 is disposed in the first display region R1, and the light-emitting element 100b of the second pixel unit 102 is disposed in the second display region R2.

In the embodiments of the present disclosure, the first pixel unit 101 includes a first light-emitting element 30 and a first pixel circuit 10. The second pixel unit 102 includes a second light-emitting element 40 and a second pixel circuit 20. The first pixel unit 101 is disposed in the first display region R1. The second pixel circuit 20 of the second pixel unit 102 is disposed in the first display region R1, and the second light-emitting element 40 of the second pixel unit 102 is disposed in the second display region R2.

The second pixel circuits 20 are spaced apart between the plurality of first pixel circuits 10. For example, in the embodiments of the present disclosure, at most one second pixel circuit 20 is disposed between adjacent two first pixel circuits 10.

The second light-emitting element 40 and the second pixel circuit 20 of the same second pixel unit 102 are disposed in the same row. For example, as shown in FIG. 4, the second light-emitting element 40 and the second pixel circuit 20 connected to the second light-emitting element 40 are disposed in the same row. That is, the light-emitting signals of the second light-emitting elements 40 come from the same row of second pixel circuits 20.

In the embodiments of the present disclosure, since the second pixel circuit 20 driving the second light-emitting element 40 is disposed in the first display region R1, the second display region R2 has higher light transmittance, and the under-screen camera corresponding to the second display region R2 can receive enough ambient light for normal photographing, without the need to form holes in the display panel, or perform other processing on the display panel. With the second light-emitting element 40 in the second display region R2, the second display region R2 still has the display capability, and thus the display panel has a better display effect.

The second pixel circuit 20 and the second light-emitting element 40 are connected by a conductive line L1, and the conductive line L1 extends from the first display region R1 to the second display region R2. One end of the conductive line L1 is connected to the second pixel circuit 20, and the other end of the conductive line L1 is connected to the second light-emitting element 40.

In some embodiments, the conductive line L1 is made from a transparent conductive material. For example, the conductive line L1 is made from a conductive oxide material. The conductive oxide material includes, but is not limited to, indium tin oxide (ITO). By making the conductive line L1 with a transparent conductive material, the conductive line L1 blocks less light, thereby reducing the effect of the conductive line L1 on the display effect.

In some embodiments, the distribution density of the second light-emitting elements 40 in the second display region R2 is the same as the distribution density of the first light-emitting elements 30 in the first display region R1. The distribution density of the light-emitting elements refers to the number of the light-emitting elements distributed in a unit area. The higher the distribution density, the higher the resolution, whereas the lower the distribution density, the lower the resolution. The distribution density of the second light-emitting elements 40 is the same as the distribution density of the first light-emitting elements 30, that is, the resolution of the second display region R2 is the same as the resolution of the first display region R1. The resolution of the first display region R1 is the same as the resolution of the second display region R2, which can further improve the display effect of the display panel.

In other embodiments, the distribution density of the second light-emitting elements 40 is greater than or less than the distribution density of the first light-emitting elements 30. That is, the resolution of the second display region R2 is greater or less than the resolution of the first display region R1.

The light-emitting area of a single second light-emitting element 40 is the same as the light-emitting area of a single first light-emitting element 30. The light-emitting area of the light-emitting element refers to the area of the orthographic projection of the light-emitting region of the light-emitting element on the base substrate BS. The light-emitting area has a certain effect on luminance. In order to achieve the same luminance, the light-emitting element with a smaller light-emitting area usually needs to be driven by a larger current or voltage, while the lifetime of the light-emitting element will be shortened when it's driven by a larger current or voltage. In the present disclosure, since the light-emitting area of the second light-emitting element 40 is the same as the light-emitting area of the first light-emitting element 30, the second light-emitting element 40 and the first light-emitting element 30 are driven by the current at the same strength or voltage at the same strength, such that the lifetime of the second light-emitting element 40 approximates the lifetime of the first light-emitting element 30.

In some other embodiments, the light-emitting area of the single second light-emitting element 40 is smaller than the light-emitting area of the single first light-emitting element 30, to further increase the light transmittance of the second display region R2, thereby increasing the photographing effect of the under-screen camera.

As shown in FIG. 4, each pixel unit 100 further includes a connecting element CE0. Each pixel circuit 100a is connected to the light-emitting element 100b by the connecting element CE0. That is, the first pixel circuit 10 is connected to the first light-emitting element 30 by a connecting element CE0, and the second pixel circuit 20 is connected to the second light-emitting element 40 by a connecting element CE0.

Figure 5:
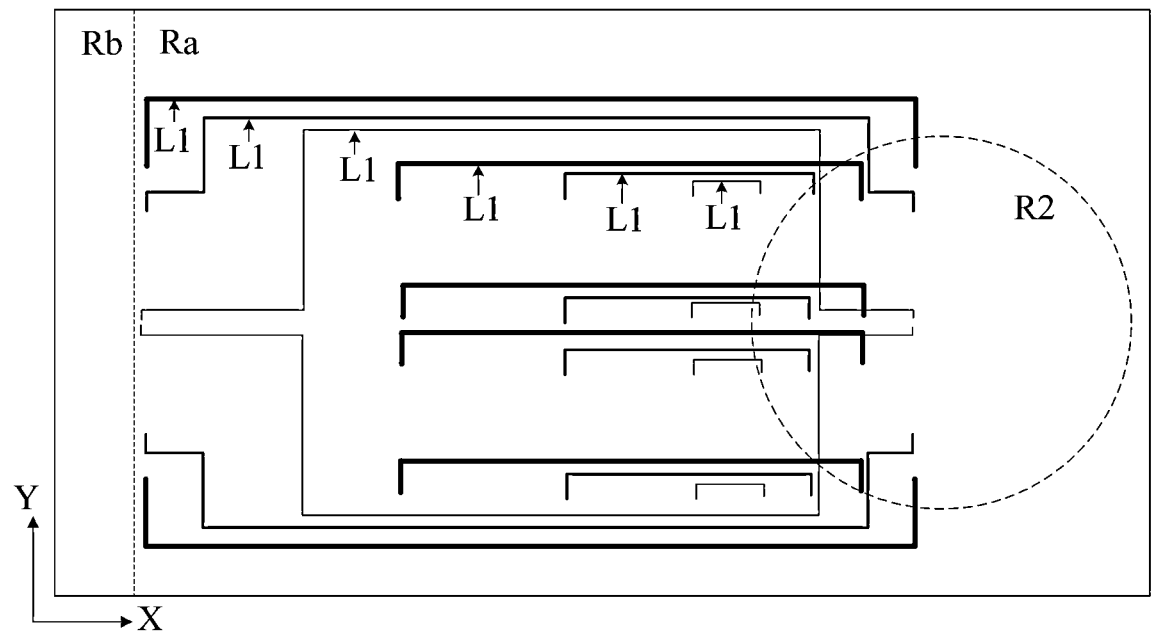
FIG. 5 is a schematic diagram of a conductive line in display panel according to some embodiments of the present disclosure.

FIG. 5 is a schematic diagram of a conductive line in a display panel according to some embodiments of the present disclosure. FIG. 5 illustratively shows a plurality of conductive lines L1. The plurality of conductive lines L1 are disposed in the same conductive line pattern layer. For example, the plurality of conductive lines L1 are formed of the same conductive layer through a patterning process. Alternatively, the plurality of conductive lines L1 are disposed in several different conductive line pattern layers, different conductive line pattern layers are separated from each other by an insulating layer, and the conductive lines L1 in the same conductive line pattern layer are formed of the same conductive layer through the patterning process. A plurality of conductive line pattern layers are provided to prevent the conductive lines L1 in the same conductive line pattern layer from being too dense, thereby reducing the accuracy requirement of the patterning process performed on the conductive line pattern layer. In some other embodiments, the same conductive line L1 is disposed in different conductive line pattern layers. For example, one conductive line L1 includes two segments disposed in two conductive line pattern layers, and the two segments are connected through a via hole.

Referring to FIG. 2, the first display region R1 includes a main display region Rb and an auxiliary display region Ra. The main display region Rb is on at least one side of the auxiliary display region Ra, and the auxiliary display region Ra is adjacent to the second display region R2. For example, in the embodiments of the present disclosure, the main display region Rb surrounds the auxiliary display region Ra, that is, the auxiliary display region Ra is surrounded by the main display region Rb. The auxiliary display region Ra surrounds the second display region R2. The second pixel circuit 20 is disposed in the auxiliary display region Ra.

The pixel circuit of the second pixel unit 102 is disposed in the region adjacent to the second display region R2, such that the second pixel circuit 20 and the second light-emitting element 40 can be connected by a shorter conductive line L1, which makes it easier to arrange the circuit structure of the display panel. In addition, the shorter conductive line L1 has smaller resistance.

In other embodiments, the first display region R1 only includes the main display region Rb, and the second pixel circuit 20 is disposed in the main display region Rb. For example, the second pixel circuits 20 and the first pixel circuits 10 are alternately arranged in the main display region Rb, and the conductive line L1 extends from the main display region Rb to the second display region R2.

Two ends of the conductive line L1 are connected to the second pixel circuit 20 and the second light-emitting element 40. For example, one end of the conductive line L1 is connected to the second pixel circuit 20 through a via hole, and the other end of the conductive line L1 is connected to the second light-emitting element 40 through a via hole.

Figure 6:
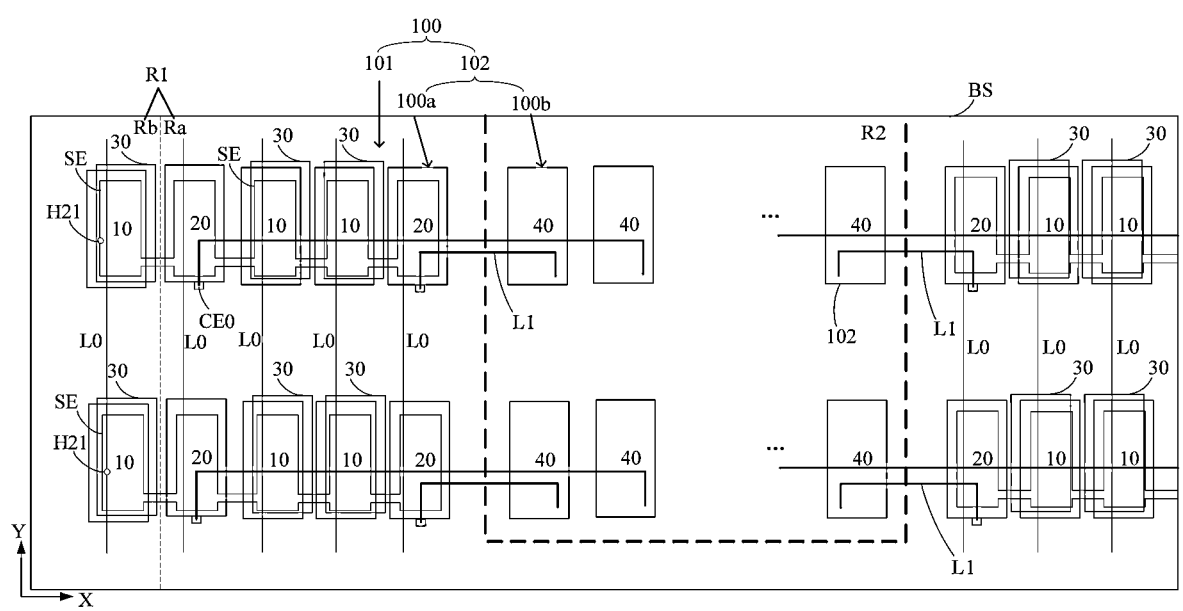
FIG. 6 is a schematic structural diagram of a display panel according to some embodiments of the present disclosure.

FIG. 6 is a schematic structural diagram of a display panel according to some embodiments of the present disclosure. As shown in FIG. 6, there is an overlapping region between the conductive line L1 and the pixel circuit 100a that is disposed between the second pixel circuit 20 and the second light-emitting element 40, that is, the orthographic projection of the conductive line L1 on the base substrate BS is partially overlapped with the orthographic projection of the pixel circuit 100a on the base substrate BS. As a result, the conductive line L1 and the pixel circuit 100a which are overlapped with each other are coupled to form parasitic capacitance, resulting a luminance difference between some of the light-emitting elements, thereby resulting in display defects, such as mura. In the auxiliary display region Ra, the conductive line L1 and the pixel circuit are coupled with each other, which easily causes the auxiliary display region Ra to be darker. For example, the auxiliary display region Ra is significantly darker at a high grayscale than at a lower grayscale.

As shown in FIG. 6, in order to avoid the defects caused by the parasitic capacitance formed due to the coupling between the conductive line L1 and the pixel circuit 100a (e.g., the first pixel circuit 10 and the second pixel circuit 20 in FIG. 6) which are overlapped with each other, the display panel further includes a constant voltage line L0 and a plurality of shield electrodes SE. The constant voltage line L0 is configured to provide a constant voltage to the pixel circuit 100a.

At least one shield electrode SE corresponds to at least one pixel circuit 100a. The orthographic projection of the shield electrode SE on the base substrate BS is at least partially overlapped with the orthographic projection of the corresponding at least one pixel circuit 100a on the base substrate BS. The shield electrode SE is electrically connected to the constant voltage line L0, that is, the shield electrode SE can maintain a constant potential under the action of the constant voltage line L0, thereby playing a shielding effect, which can reduce the coupling between the conductive line L1 and the pixel circuit 100a.

In a direction perpendicular to the base substrate BS, the shield electrode SE is disposed between the conductive line L1 and the pixel circuit 100a. That is, in the direction perpendicular to the base substrate BS, the shield electrode SE separates the conductive line L1 from the pixel circuit 100a, such that the shield electrode SE plays a better shielding effect. In the embodiments of the present disclosure, after the pixel circuit is formed, the shield electrode SE is formed first, the conductive line L1 is formed, and then the light-emitting element is formed, such that the shield electrode SE is disposed between the conductive line L1 and the first gate signal line SL1.

In the embodiments of the present disclosure, the shield electrodes SE are distributed in the main display region Rb and the auxiliary display region Ra. The second pixel circuit 20 is disposed in the auxiliary display region Ra, such that the conductive line L1 extends directly from the auxiliary display region Ra to the second display region R2 without passing through the main display region Rb. That is, the conductive line L1 is disposed between the auxiliary display region Ra and the second display region R2. The conductive line L1 basically does not interact with the pixel circuit in the main display region Rb, and the shield electrode SE in the auxiliary display region Ra plays a shielding effect for the conductive line L1 and the pixel circuit 100a. In addition, the shield electrode SE is also provided in the main display region Rb to ensure the consistency between patterns in the patterning process. Therefore, the patterns are also formed and the shield electrodes SE are manufactured in the main display region Rb.

As shown in FIG. 6, the plurality of shield electrodes SE include a plurality of groups of shield electrodes. Each group of the plurality of groups of shield electrodes extends in a first direction Y, and the plurality of groups of shield electrodes are arranged in a second direction X. The first direction Y and the second direction X intersect and are both parallel to the base substrate BS. In the embodiments of the present disclosure, the second direction X is perpendicular to the first direction Y. That is, the plurality of shield electrodes SE are distributed in an array in a plurality of rows and a plurality of columns. The column direction is the first direction Y, and the row direction is the second direction X.

As shown in FIG. 6, at least part of the shield electrodes SE are connected, and in the connected shield electrodes SE, part of the shield electrodes SE are connected to the constant voltage line L0. For example, part of the shield electrodes SE are connected to the constant voltage line L0 through a first via hole H21, as shown in FIG. 6.

Figure 7:
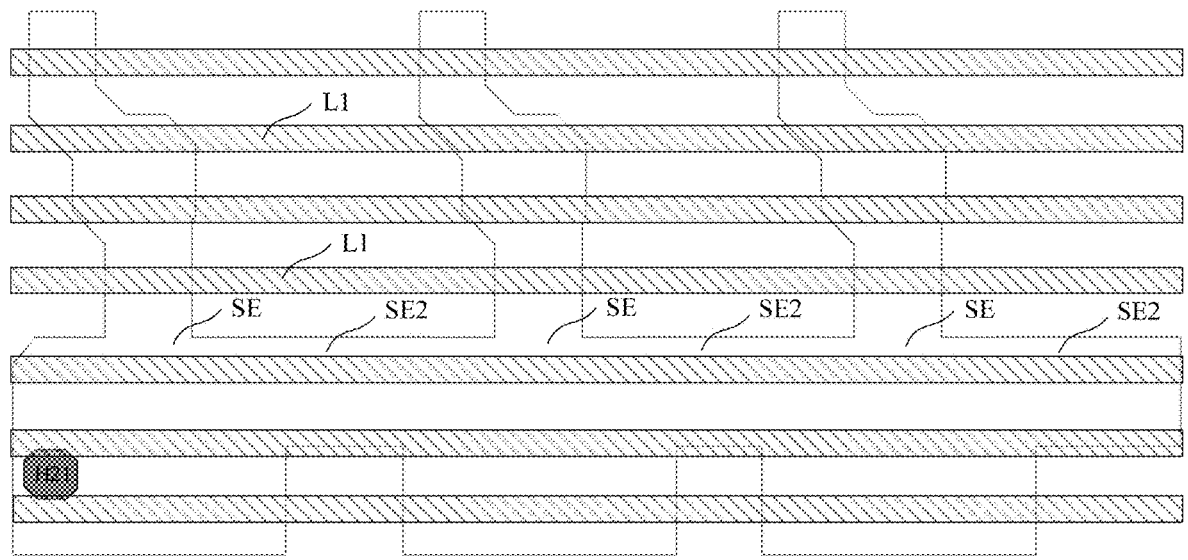
FIG. 7 is a schematic structural diagram of three connected shield electrodes according to some embodiments of the present disclosure.

The shield electrodes SE are connected with each other by a connecting portion. FIG. 7 is a schematic structural diagram of three connected shield electrodes according to some embodiments of the present disclosure. As shown in FIG. 7, a second connecting portion SE2 is provided between at least two shield electrodes SE arranged in the second direction X, and the shield electrodes SE arranged in the second direction X are connected with each other by the second connecting portion SE2. One of the shield electrodes SE is connected to the constant voltage line L0 through the first via hole H21. In FIG. 7, no second connecting portion SE2 is provided on the left side of the shield electrode SE connected to the constant voltage line L0. However, in other embodiments, the second connecting portion SE2 is provided on the left side of the shield electrode SE connected to the constant voltage line L0, such that the shield electrodes SE are connected with the adjacent shield electrodes SE on two sides by the second connecting portion SE2.

At least part of the plurality of shield electrodes SE are connected with each other such that several shield electrodes are connected as a whole. For example, FIG. 6 illustratively shows six shield electrodes SE which are connected as a whole. In the connected shield electrodes SE, only part of the shield electrodes SE are connected to the constant voltage line L0 through the via holes. For example, in FIG. 6, in the six connected shield electrodes SE, only one shield electrode SE is connected to the constant voltage line L0 through a via hole. Compared with the case where each shield electrode SE is connected to the constant voltage line L0 through a via hole, the total number of the via holes is reduced, and the manufacturing difficulty is reduced.

As each conductive line L1 is overlapped with a plurality of pixel circuits 100a, and one pixel circuit 100a also is overlapped with a plurality of conductive lines L1, the conductive line L1 is directly above the via hole. As described above, the region above the via hole is recessed, resulting in the structures in the region above the via hole to be uneven, which affects the manufacture of the conductive line L1. For example, when the conductive line L1 is manufactured through the patterning process, during exposure, the amount of exposure in the recess and the amount of exposure outside the recess is somewhat different. As a result, the line width of the formed conductive line L1 in the recess and the line width outside the recess are unequal, which affects the signals transmitted in the conductive line L1. In the embodiments of the present disclosure, at least part of the plurality of shield electrodes SE are connected with each other, and in the connected shield electrodes SE, only part of the shield electrodes SE are connected to the constant voltage line L0 through the via holes, which reduces the total number of the via holes and alleviates the situation that the traces above the via holes become thinner. For example, as shown in FIG. 7, the number of the via holes is reduced, and thus the possibility that the conductive line L1 is directly above the via hole is reduced, thereby alleviating or even avoiding the situation that the line widths of the conductive line L1 are unequal.

As shown in FIG. 6, the plurality of shield electrodes SE arranged in the direction which is parallel to the base substrate BS and intersects the extension direction of the constant voltage line L0 are connected with each other. In the embodiments of the present disclosure, the constant voltage line L0 extends in the first direction Y, and the plurality of shield electrodes SE arranged in the second direction X are connected with each other.

The orthographic projection of the first light-emitting element 30 on the base substrate BS is at least partially overlapped with the orthographic projection of the first pixel circuit 10 on the base substrate BS.

As shown in FIG. 6, the shield electrode SE connected to the constant voltage line L0 is disposed in the main display region Rb.

In the embodiments of the present disclosure, the plurality of shield electrodes SE disposed in the same row in the auxiliary display region Ra are connected with each other, and the shield electrodes SE disposed in the same row in the main display region Rb are connected to the constant voltage line L0. That is, no first via hole H21 is provided in the auxiliary display region Ra. The second pixel circuit 20 is disposed in the auxiliary display region Ra, that is, the conductive line L1 extends from the auxiliary display region Ra to the second display region R2. In this way, the conductive line L1 is completely prevented from passing right above the first via hole H21, and the first via hole H21 is also prevented from adversely affecting the conductive line L1.

Figure 8:
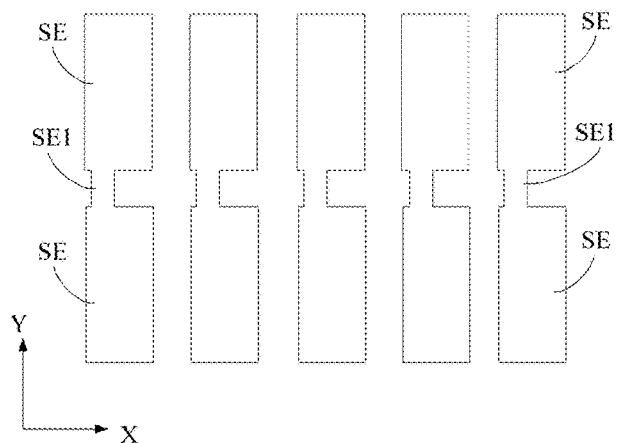
FIG. 8 is a schematic diagram showing distribution of shield electrodes according to some embodiments of the present disclosure.

In some other embodiments, the plurality of shield electrodes SE in the same column are connected with each other. For example, FIG. 8 is a schematic diagram showing distribution of shield electrodes according to some embodiments of the present disclosure. As shown in FIG. 8, a first connecting portion SE1 is provided between at least two shield electrodes SE arranged in the first direction Y, that is, the first connecting portion SE1 is provided between adjacent shield electrodes SE arranged in the same column, and the adjacent shield electrodes SE are connected by the first connecting portion SE1.

Figure 9:
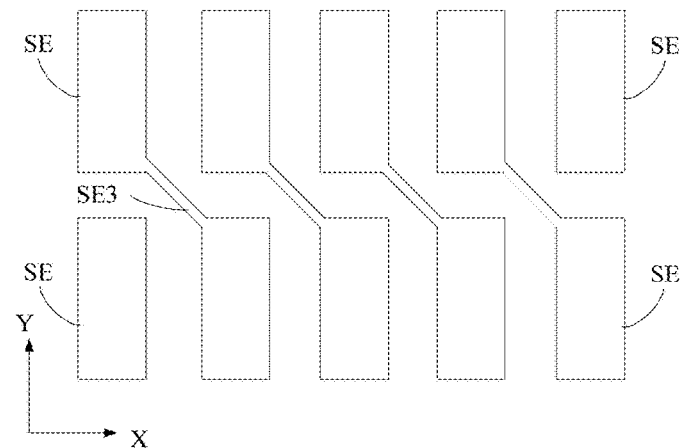
FIG. 9 is a schematic diagram showing distribution of shield electrodes according to some embodiments of the present disclosure.

For example, FIG. 9 is a schematic diagram showing distribution of shield electrodes according to some embodiments of the present disclosure. As shown in FIG. 9, a third connecting portion SE3 is provided between at least two shield electrodes SE arranged in a third direction. The third direction intersects the first direction Y and the second direction X, and is parallel to the base substrate BS. The third direction is inclined relative to the first direction Y and the second direction X, and the plurality of shield electrodes SE in adjacent two rows are sequentially connected in a misaligned manner by a plurality of third connecting portions SE3.

Figure 10:
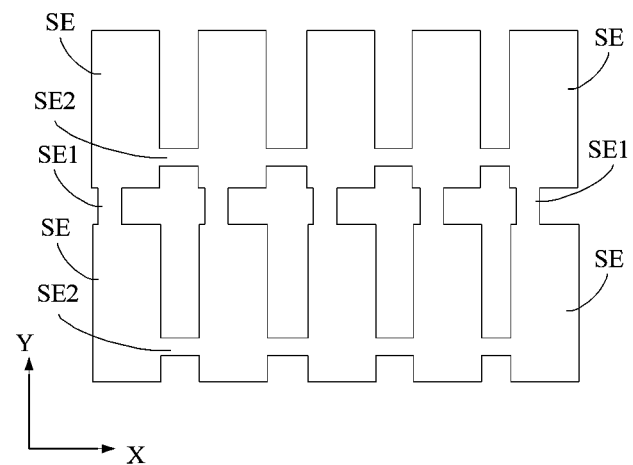
FIG. 10 is a schematic diagram showing distribution of shield electrodes according to some embodiments of the present disclosure.

For example, FIG. 10 is a schematic diagram showing distribution of shield electrodes according to some embodiments of the present disclosure. As shown in FIG. 10, the display panel is provided with both the first connection portion SE1 and the second connecting portion SE2, such that the plurality of shield electrodes SE are connected into a mesh.

Figure 11:
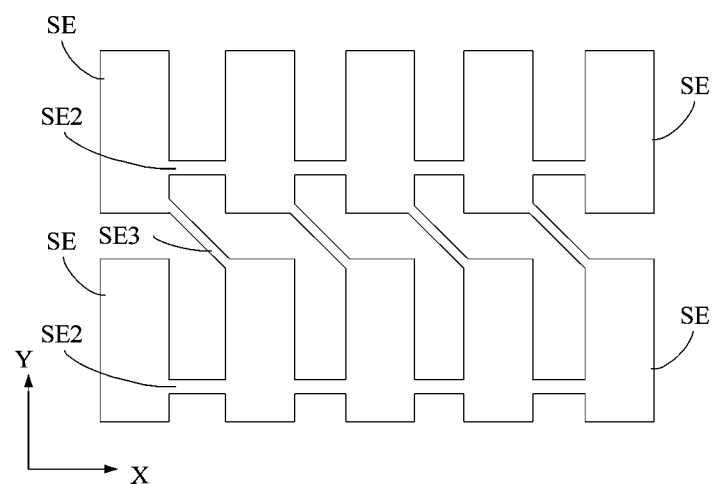
FIG. 11 is a schematic diagram showing distribution of shield electrodes according to some embodiments of the present disclosure.

For example, FIG. 11 is a schematic diagram showing distribution of shield electrodes according to some embodiments of the present disclosure. As shown in FIG. 11, the display panel is provided with both the second connecting portion SE2 and the third connecting portion SE3, such that the plurality of shield electrodes SE are connected into a mesh.

The display panel is provided with at least one of the first connecting portion SE1, the second connecting portion SE2, and the third connecting portion SE3, to connect the plurality of shield electrodes SE. For example, the first connecting portion SE1 and the third connecting portion SE3 also are provided.

Figure 12:
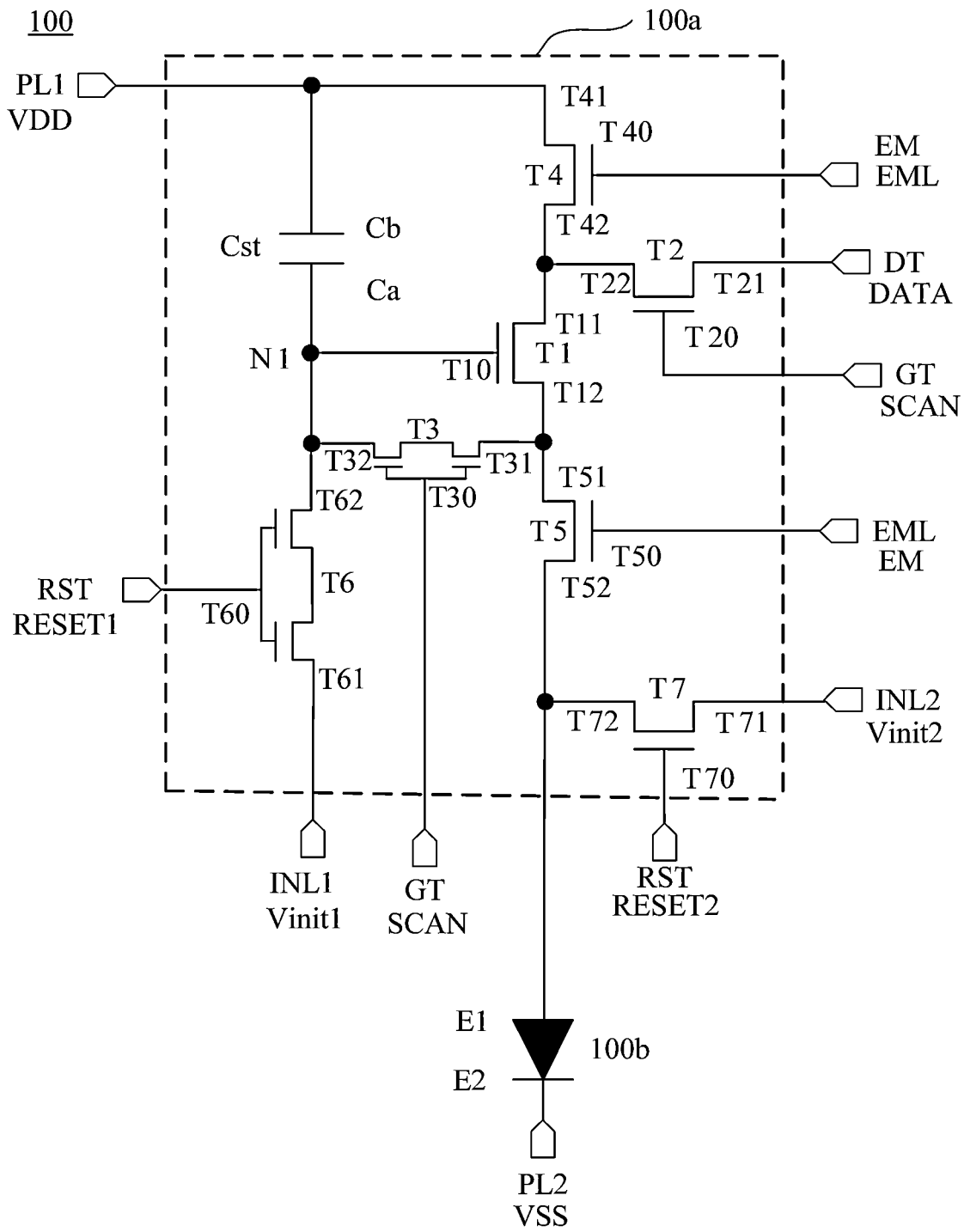
FIG. 12 is a circuit diagram of a pixel circuit according to some embodiments of the present disclosure.

FIG. 12 is a circuit diagram of a pixel circuit according to some embodiments of the present disclosure. The pixel circuit is a common low temperature poly-silicon (LTPS) AMOLED pixel circuit in the related art. In some embodiments, the pixel circuit is a 7T1C circuit, including 7 transistors and 1 capacitor. In some other embodiments, the pixel circuit is a 7T2C circuit, a 6T1C circuit, a 6T2C circuit, or a 9T2C circuit, and the embodiments of the present disclosure are illustrated by taking the 7T1C circuit as an example.

As shown in FIG. 12, the pixel circuit includes six switching transistors, one drive transistor T1 and one storage capacitor Cst. The six switching transistors includes a data writing transistor T2, a threshold compensation transistor T3, a first light-emitting control transistor T4, a second light-emitting control transistor T5, a first reset transistor T6, and a second reset transistor T7. The transistor includes a gate, a first electrode and a second electrode. One of first electrode and the second electrode of the transistor is a source and the other one is a drain. The light-emitting element 100b includes a first electrode E1, a second electrode E2, and a light-emitting functional layer disposed between first electrode E1 and second electrode E2. For example, the first electrode E1 is an anode and the second electrode E2 is a cathode. Generally, the threshold compensation transistor T3 and the first reset transistor T6 adopt a dual-gate thin film transistor (TFT) to reduce the leakage current.

The display panel further includes a gate line GT, a data line DT, a first power line PL1, a second power line PL2, a light-emitting control signal line EML, a first initialization signal line INL1, a second initialization signal line INL2, a reset control signal line RST, and the like. For example, in other embodiments, the reset control signal line RST includes two types of reset control signal lines, i.e., a first reset control signal line and a second reset control signal line. The first reset control signal line is configured to control the first reset transistor T6 and the second reset control signal line is configured to control the second reset transistor T7.

The gate line GT is configured to provide a scan signal SCAN to the pixel unit 100.

The data line DT is configured to provide a data signal DATA, i.e., a data voltage VDATA, to the pixel unit 100.

The first power line PL1 is configured to provide a constant first voltage signal VDD to the pixel unit 100, and the second power line PL2 is configured to provide a constant second voltage signal VSS to the pixel unit 100. The potential of the first voltage signal VDD is higher than the potential of the second voltage signal VSS.

The light-emitting control signal line EML is configured to provide a light-emitting control signal EM to the pixel unit 100.

The first initialization signal line INL1 is configured to provide a first initialization signal Vinit1 to the pixel unit 100. The second initialization signal line INL2 is configured to provide a second initialization signal Vinit2 to the pixel unit 100. For example, the first initialization signal Vinit1 and the second initialization signal Vinit2 are constant voltage signals, and the magnitude of the first initialization signal Vinit1 and the magnitude of the second initialization signal Vinit2 maybe between, but are not limited to be between, the first voltage signal VDD and the second voltage signal VSS. For example, the potential of the first initialization signal Vinit1 and the potential of the second initialization signal Vinit2 are lower than or equal to the potential of the second voltage signal VSS.

In some embodiments, the first initialization signal line INL1 and the second initialization signal line INL2 are connected to each other, and are both configured to provide the initialization signals Vinit to the pixel unit 100. That is, the first initialization signal Vinit1 and the second initialization signal Vinit2 are equal, both being Vinit.

Figure 13:
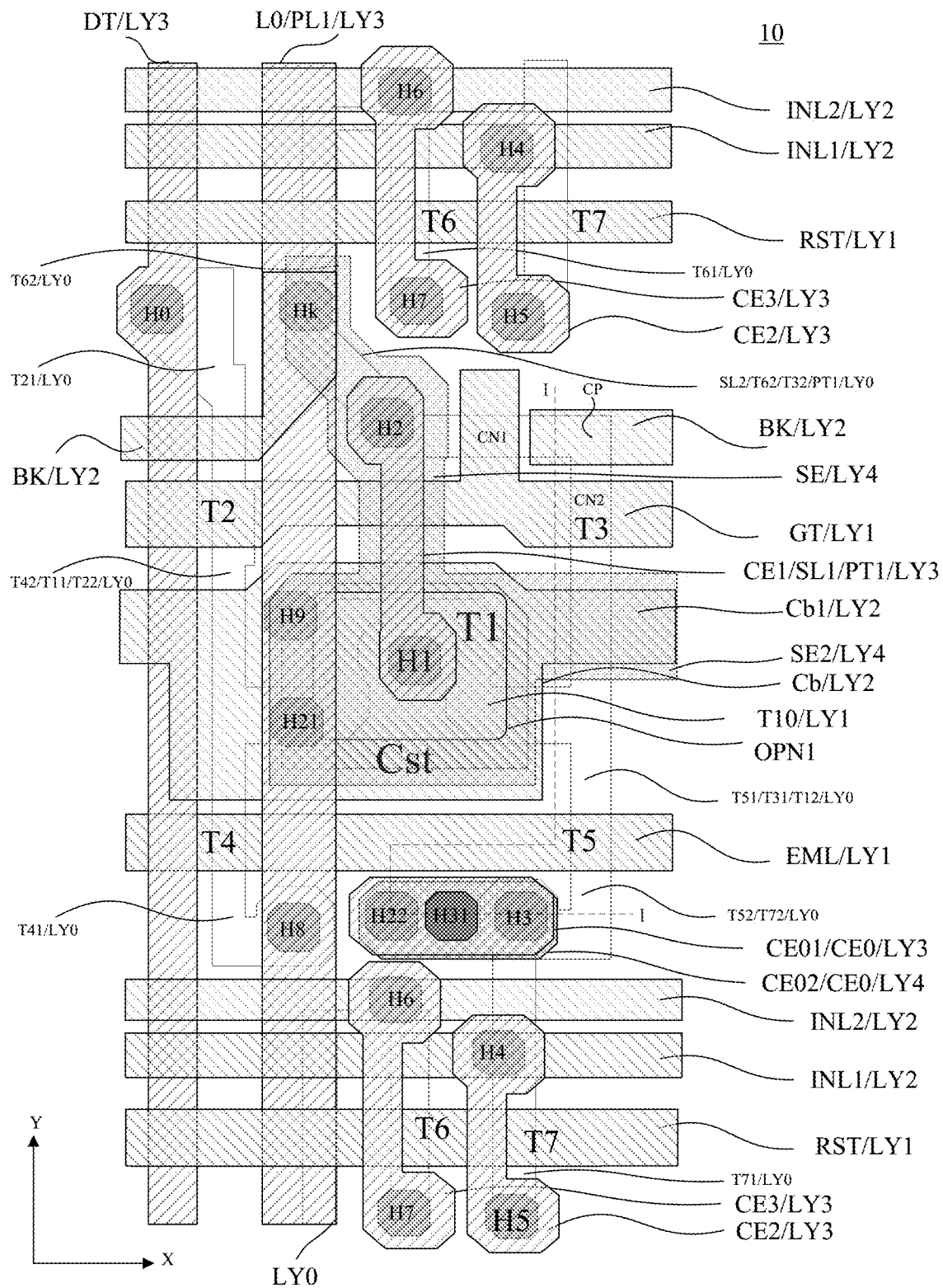
FIG. 13 is a schematic structural diagram of a pixel circuit according to some embodiments of the present disclosure.

The reset control signal line RST is configured to provide a reset control signal RESET1 or RESET2 to the pixel unit 100. FIG. 13 is a schematic structural diagram of a pixel circuit according to some embodiments of the present disclosure. The pixel circuit shown in FIG. 13 corresponds to the first pixel circuit 10 that is in the upper right corner of FIG. 6 and connected to the constant voltage line L0. In the two first reset transistors T6 shown in FIG. 13, the first reset transistor T6 in the lower part is the first reset transistor T6 in the row of pixel circuits adjacent to the pixel circuit shown in FIG. 13. In the two second reset transistors T7 shown in FIG. 13, the second reset transistor T7 in the upper part is the second reset transistor T7 in another row of pixel circuits adjacent to the pixel circuit shown in FIG. 13. In the embodiments of the present disclosure, in the pixel units in different rows, for example, in the pixel units in adjacent two rows, the gate T60 of the first reset transistor T6 in the pixel circuit in one row of pixel units and the gate T70 of the second reset transistor T7 in the pixel circuit in the other row of pixel units are connected to the same reset control signal line RST, such that the reset control signal line RST can be reused to control the first reset transistor T6 and the second reset transistor T7. When the first reset transistor T6 is reset, the reset control signal line RST connected to the gate T60 of the first reset transistor T6 provides the reset control signal RESET1, and when the second reset transistor T7 is reset, the reset control signal line RST connected to the gate T70 of the second reset transistor T7 provides the reset control signal RESET2.

The reset control signal line RST is also configured to provide other signals. For example, in some embodiments, the first reset transistor T6 is controlled by means of the first reset control signal line and the second reset transistor T7 is controlled by means of the second reset control signal line. In this case, the first reset control signal line is configured to provide a reset control signal to the first reset transistor T6, and the second reset control signal line is configured to provide a scan signal SCAN to the second reset transistor T7.

As shown in FIG. 12, the drive transistor T1 is electrically connected to the light-emitting element 100b, and the drive transistor T1 is configured to output a driving current under the action of the scan signal SCAN, the data signal DATA, the first voltage signal VDD, the second voltage signal VSS, or the like, so as to drive the light-emitting element 100b to emit light.

Exemplarily, the light-emitting element 100b is an organic light-emitting diode, and the light-emitting element 100b emits red light, green light, blue light, white light, or the like under the drive of the corresponding pixel circuit 100a. For example, one pixel includes, but is not limited to, a pixel unit emitting red light, a pixel unit emitting green light, and a pixel unit emitting blue light. The number of the pixel units included in one pixel and the light-emitting color of each pixel unit are set based on needs. The turn-on or turn-off, the luminance and light-emitting duration of the light-emitting element is controlled under the action of the drive transistor T1, the scan signal SCAN, the data signal DATA, the first voltage signal VDD, the second voltage signal VSS, and the like.

As shown in FIG. 12, the gate T20 of the data writing transistor T2 is connected to the gate line GT, the first electrode T21 of the data writing transistor T2 is connected to the data line DT, and the second electrode T22 of the data writing transistor T2 is connected to the first electrode T11 of the drive transistor T1.

The gate T30 of the threshold compensation transistor T3 is connected to the gate line GT, the first electrode T31 of the threshold compensation transistor T3 is connected to the second electrode T12 of the drive transistor T1, and the second electrode T32 of the threshold compensation transistor T3 is connected to the gate T10 of the drive transistor T1.

The gate T40 of the first light-emitting control transistor T4 is connected to the light-emitting control signal line EML, the first electrode T41 of the first light-emitting control transistor T4 is connected to the first power line PL1, and the second electrode T42 of the first light-emitting control transistor T4 is connected to the first electrode T11 of the drive transistor T1. The gate T50 of the second light-emitting control transistor T5 is connected to the light-emitting control signal line EML, the first electrode T51 of the second light-emitting control transistor T5 is connected to the second electrode T12 of the drive transistor T1, and the second electrode T52 of the second light-emitting control transistor T5 is connected to the first electrode E1 of the light-emitting element 100b.

The first reset transistor T6 is connected to the gate T10 of the drive transistor T1, and is configured to reset the gate T10 of the drive transistor T1. The second reset transistor T7 is connected to the first electrode E1 of the light-emitting element 100b, and is configured to reset the first electrode E1 of the light-emitting element 100b. For example, as shown in FIG. 12, the first electrode T61 of the first reset transistor T6 is connected to the first initialization signal line INL1, the second electrode T62 of the first reset transistor T6 is connected to the gate T10 of the drive transistor T1, and the gate T60 of the first reset transistor T6 is connected to the reset control signal line RST.

The gate T70 of the second reset transistor T7 is connected to the reset control signal line RST, the first electrode T71 of the second reset transistor T7 is connected to the second initialization signal line INL2, and the second electrode T72 of the second reset transistor T7 is connected to the second electrode T52 of the second light-emitting control transistor T5. That is, the second electrode T72 of the second reset transistor T7 is connected to the first electrode E1 of the light-emitting element 100b.

The first initialization signal line INL1 is connected to the gate of the drive transistor T1 through the first reset transistor T6. The second initialization signal line INL2 is connected to the first electrode E1 of the light-emitting element 100b through the second reset transistor T7. In the embodiments of the present disclosure, the first initialization signal line INL1 and the second initialization signal line INL2 are two signal lines, which are insulated from each other to input signals respectively. In other embodiments, the first initialization signal line INL1 and the second initialization signal line INL2 are connected with each other so as to input the same initialization signal.

As shown in FIG. 12, the first electrode Ca of the storage capacitor Cst is connected to the gate T10 of the drive transistor T1, and the second electrode Cb of the storage capacitor Cst is connected to the first power line PL1.

A node N1 is shown in FIG. 12. Capacitance is formed between the node N1 and the conductive line L1, and the shield electrode SE separates the node N1 from the conductive line L1 to achieve a shielding effect.

As shown in FIG. 13, the pixel circuit further includes a first gate signal line SL1 and a second gate signal line SL2.

The first electrode T11 of the drive transistor T1 is connected to the first power line PL1, the gate T10 of the drive transistor T1 is connected to the first gate signal line SL1, and the first gate signal line SL1 is connected to the second gate signal line SL2. The second gate signal line SL2 is connected to the second electrode T62 of the first reset transistor T6, the first electrode T61 of the first reset transistor T6 is connected to the first initialization signal line INL1, and the gate T60 of the first reset transistor T6 is connected to the reset control signal line RST. The first electrode Ca of the storage capacitor Cst is connected to the gate T10 of the drive transistor T1, and the second electrode Cb of the storage capacitor Cst is connected to the first power line PL1.

In the embodiments of the present disclosure, in the direction intersecting the extension direction of the constant voltage line L0, for example, in the second direction X, the second electrodes Cb of the storage capacitors Cst of the adjacent pixel circuits 100a are connected with each other, and the orthographic projection of the second connecting portion SE2 between the connected shield electrodes SE on the base substrate BS is at least partially overlapped with the orthographic projection of the connecting portion Cb1 between the connected second electrodes Cb on the base substrate BS.

The connecting portion Cb1 between the connected second electrodes Cb is blocked by the second connecting portion SE2, which can achieve a certain shielding effect, thereby weakening the coupling between the connecting portion Cb1 between the connected second electrodes Cb and other structure in the display panel.

In some other embodiments, in the direction intersecting the extension direction of the constant voltage line L0, for example, in the second direction X, the second electrodes Cb of the storage capacitors Cst of the adjacent pixel circuits 100a are spaced apart from each other, which is beneficial to the RC type load of the first power line PL1.

In the embodiments of the present disclosure, one end of the first gate signal line SL1 is connected to the gate T10 of the drive transistor T1 through a via hole H1, and the other end of the first gate signal line SL1 is connected to the second electrode T62 of the first reset transistor T6 through a via hole H2. The first gate signal line SL1 is also referred to as a third connecting bridge CE1.

The pixel circuit further includes a first connecting bridge CE2, a second connecting bridge CE3, and the third connecting bridge CE1. One end of the first connecting bridge CE2 is connected to the first initialization signal line INL1 through a via hole H4, and the other end of the first connecting bridge CE2 is connected to the first electrode T61 of the first reset transistor T6 through a via hole H5.

One end of the second connecting bridge CE3 is connected to the second initialization signal line INL2 through a via hole H6, and the other end of the second connecting bridge CE3 is connected to the first electrode T71 of the second reset transistor T7 through a via hole H7.

The first power line PL1 is connected to the first electrode T41 of the first light-emitting control transistor T4 through a via hole H8, and the first power line PL1 is connected to the second electrode Cb of the storage capacitor Cst through a via hole H9.

The data line DT is connected to the first electrode T21 of the data writing transistor T2 through a via hole H0.

The shield electrode SE and the constant voltage line L0 are provided in order to stabilize the potential on the first gate signal line SL1 and the potential on the second gate signal line SL2, i.e., the potential of the first node N1. The constant voltage line L0 is configured to provide a constant voltage to the pixel circuit. The shield electrode SE is connected to the constant voltage line L0, to stabilize the potential on the shield electrode SE, thereby achieving a shielding effect. The orthographic projection of the first gate signal line SL1 on the base substrate BS is within the orthographic projection of the shield electrode SE on the base substrate BS.

In order that the shield electrode SE can achieve a better shielding effect so as to increase the shielding strength, the orthographic projection of at least one or all of the gate T10 of the drive transistor T1, the first gate signal line SL1, the second gate signal line SL2, the second electrode T62 of the first reset transistor T6, and the connecting portion between the second electrode Cb of the storage capacitor Cst and the first power line PL1 on the base substrate BS is completely within the orthographic projection of the shield electrode SE on the base substrate BS.

To further mitigate the display defects and to improve the display effect, the distance between the boundary of the orthographic projection of each of the gate T10 of the drive transistor T1, the first gate signal line SL1, the second gate signal line SL2, the second electrode T62 of the first reset transistor T6, and the connecting portion between the second electrode Cb of the storage capacitor Cst and the first power line PL1 on the base substrate BS and the boundary of the orthographic projection of the shield electrode SE on the base substrate BS is no less than 1.75 μm.

For example, the distance between the boundary of the orthographic projection of the first gate signal line SL1 on the base substrate BS and the boundary of the orthographic projection of the shield electrode SE on the base substrate BS is not less than 1.75 μm. Exemplarily, the distance between the boundary of the orthographic projection of the first gate signal line SL1 on the base substrate BS and the boundary of the orthographic projection of the shield electrode SE on the base substrate BS is 2.33 μm.

For example, the orthographic projection of the second gate signal line SL2 on the base substrate BS is also within the orthographic projection of the shield electrode SE on the base substrate BS, and the distance between the boundary of the orthographic projection of the second gate signal line SL2 on the base substrate BS and the boundary of the orthographic projection of the shield electrode SE on the base substrate BS is not less than 1.75 μm.

In some embodiments, the first gate signal line SL1 and the second gate signal line SL2 are made from different materials. For example, the material of the first gate signal line SL1 includes metal, and the material of the second gate signal line SL2 includes a semiconductor material, which are conducted to be a conductive material.

In some embodiments, the constant voltage line L0 includes the first power line PL1 or the first initialization signal line INL1. For example, in the embodiments of the present disclosure, the first power line PL1 is used as the constant voltage line L0 to save wiring. In other embodiments, the first initialization signal line INL1 is used as the constant voltage line to save wiring. The constant voltage line L0 is not limited to include the first power line PL1 and the first initialization signal line INL1, and all the signal lines providing a constant voltage in the pixel circuit can be taken as the constant voltage line L0. Certainly, in some other embodiments, a signal line providing a constant voltage also is added as the constant voltage line L0.

As shown in FIG. 13, the pixel circuit 100a further includes a block BK. In the embodiments of the present disclosure, the threshold compensation transistor T3 is a dual-gate thin film transistor, and the threshold compensation transistor T3 includes a first channel CN1 and a second channel CN2. The first electrode T31 of the threshold compensation transistor T3 is connected to the second electrode T12 of the drive transistor T1, the second electrode T32 of the threshold compensation transistor T3 is connected to the second gate signal line SL2, and the gate T30 of the threshold compensation transistor T3 is connected to the gate line GT. The first channel CN1 and the second channel CN2 are connected by a conductive connecting portion CP. The block BK is connected to the first power line PL1, and the orthographic projection of the block BK on the base substrate BS is at least partially overlapped with the orthographic projection of the conductive connecting portion CP on the base substrate BS.

The conductive connecting portion CP is blocked by the block BK. In the embodiments of the present disclosure, the block BK of the pixel unit in an adjacent column is configured to block the conductive connecting portion CP of the threshold compensation transistor T3 of the pixel unit in the current column.

As shown in FIG. 13, the block BK is connected to the first power line PL1 through a second via hole Hk. The orthographic projection of the second via hole Hk on the base substrate BS is at least partially within the orthographic projection of the shield electrode SE on the base substrate BS.

In the embodiments of the present disclosure, the orthographic projection of the second via hole Hk on the base substrate BS is completely within the orthographic projection of the shield electrode SE on the base substrate BS.

In some embodiments, the orthographic projection of the block BK on the base substrate BS is partially overlapped with the orthographic projection of the second gate signal line SL2 on the base substrate BS, such that the block BK can also achieve a certain a shielding effect for the second gate signal line SL2. Thus, the shield electrode SE and the block BK form a double shielding effect for the second gate signal line SL2, which helps stabilize the potential of the second gate signal line SL2.

Figure 14:
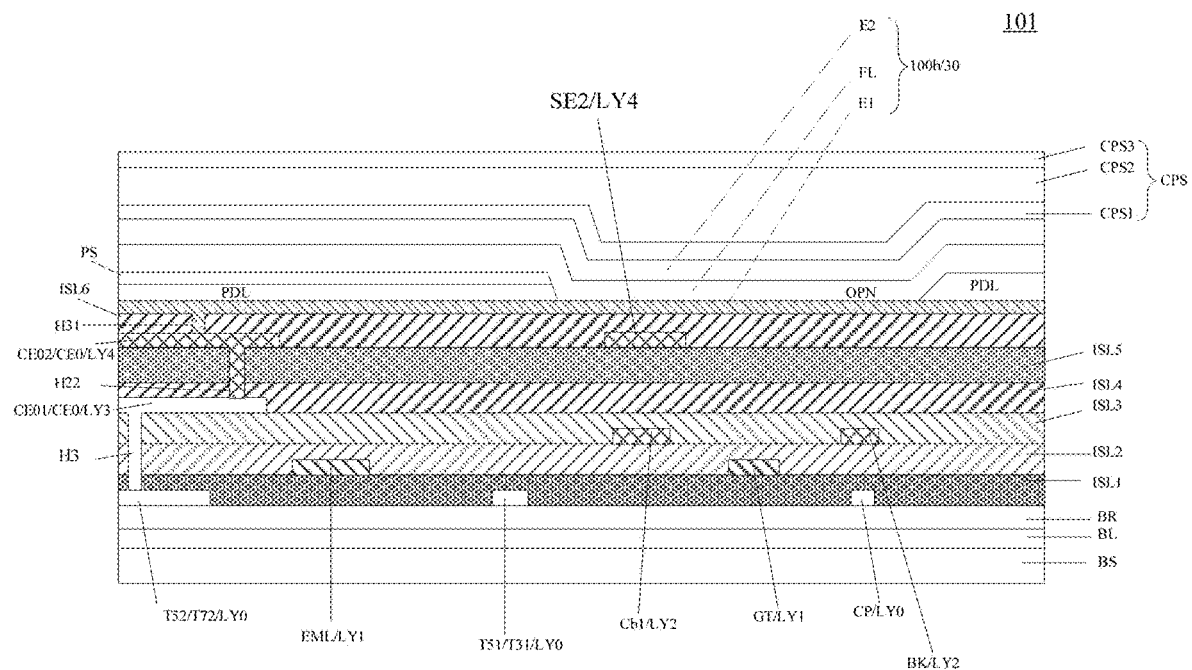
FIG. 14 is a sectional view along I-I of FIG. 13.

FIG. 14 is a sectional view along I-I of FIG. 13. As shown in FIG. 14, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3.

The aforementioned connecting element CE0 includes a connecting electrode CE01 and a connecting electrode CE02. The third conductive layer LY3 includes the connecting electrode CE01. The connecting electrode CE01 is connected to the second electrode T52 of the second light-emitting control transistor T5 through a via hole H3 penetrating through the first insulating layer ISL1, the second insulating layer ISL2 and the third insulating layer ISL3. A fourth insulating layer ISL4 and a fifth insulating layer ISL5 are disposed on the third conductive layer LY3, and a fourth conductive layer LY4 is disposed on the fourth insulating layer ISL4 and the fifth insulating layer ISL5. The fourth conductive layer LY4 includes the connecting electrode CE02, and the connecting electrode CE02 is connected to the connecting electrode CE01 through a via hole H22 penetrating through the fourth insulating layer ISL4 and the fifth insulating layer ISL5. A sixth insulating layer ISL6 is disposed on the fourth conductive layer LY4.

FIG. 13 shows the first pixel circuit. The first light-emitting element 30 is connected to the connecting electrode CE02 through a via hole H31 penetrating through the sixth insulating layer ISL6. The light-emitting element 100b includes a first electrode E1, a second electrode E2, and a light-emitting functional layer FL between the first electrode E1 and the second electrode E2.

For the second pixel circuit, in the section at the same position as that in FIG. 13, the conductive line L1 is connected to the connecting electrode CE02 through the via hole H31.

The channel of each transistor and the first electrode and the second electrode on two sides of the channel are disposed in the active layer LY0. The reset control signal line RST, the gate line GT, the gate T10 of the drive transistor (the first electrode Ca of the storage capacitor Cst), and the light-emitting control signal line EML are disposed in the first conductive layer LY1. The first initialization signal line INL1, the second electrode Cb of the storage capacitor Cst, and the second initialization signal line INL2 are disposed in the second conductive layer LY2. The data line DT, the first power line PL1, the first gate signal line SL1, the first connecting bridge CE2, the second connecting bridge CE3, and the connecting electrode CE01 are disposed in the third conductive layer LY3. The shield electrode SE is disposed in the fourth conductive layer LY4.

During the process of manufacturing the display panel, a self-aligned process is adopted to perform a conducting process on a semiconductor pattern layer by using the first conductive layer LY1 as a mask. The semiconductor pattern layer is formed by patterning a semiconductor thin film. For example, the semiconductor pattern layer is heavily doped through an ion implantation process, such that the portion, not covered by the first conductive layer LY1, of the semiconductor pattern layer is conducted to form a source region (e.g., the first electrode T11) and a drain region (e.g., the second electrode T12) of the drive transistor T1, a source region (e.g., the first electrode T21) and a drain region (e.g., the second electrode T22) of the data writing transistor T2, a source region (e.g., the first electrode T31) and a drain region (e.g., the second electrode T32) of the threshold compensation transistor T3, a source region (e.g., the first electrode T41) and a drain region (e.g., the second electrode T42) of the first light-emitting control transistor T4, a source region (e.g., the first electrode T51) and a drain region (e.g., the second electrode T52) of the second light-emitting control transistor T5, a source region (e.g., the first electrode T61) and a drain region (e.g. the second electrode T62) of the first reset transistor T6, and a source region (e.g., the first electrode T71) and the drain region (e.g., the second electrode T72) of the second reset transistor T7.

The portion, covered by the first conductive layer LY1, of the semiconductor pattern layer retains the semiconductor properties, and forms a channel region of the drive transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7.

For example, as shown in FIG. 13, the second electrode T72 of the second reset transistor T7 and the second electrode T52 of the second light-emitting control transistor T5 are integrally formed; the first electrode T51 of the second light-emitting control transistor T5, the second electrode T12 of the drive transistor T1, and the first electrode T31 of the threshold compensation transistor T3 are integrally formed; the first electrode T11 of the drive transistor T1, the second electrode T22 of the data writing transistor T2, and the second electrode T42 of the first light-emitting control transistor T4 are integrally formed; and the second electrode T32 of the threshold compensation transistor T3 and the second electrode T62 of the first reset transistor T6 are integrally formed. In some embodiments, as shown in FIG. 13, the first electrode T71 of the second reset transistor T7 and the first electrode T61 of the first reset transistor T6 are integrally formed.

In some embodiments, the channel regions of the transistors are made from monocrystalline silicon, polycrystalline silicon (e.g., low temperature poly-silicon), or a metal oxide semiconductor material (e.g., IGZO, AZO, etc.). In an example, the transistors are P-type low temperature poly-silicon (LTPS) thin film transistors. In another example, the threshold compensation transistor T3 and the first reset transistor T6 which are directly connected to the gate of the drive transistor T1 are metal oxide semiconductor thin film transistors, that is, the channels of the transistors are made from a metal oxide semiconductor material (e.g., IGZO, AZO, etc.). The metal oxide semiconductor thin film transistor has a lower leakage current, which helps reduce the leakage current of the gate of the drive transistor T1.

In some embodiments, the transistors include thin film transistors in a plurality of structures, for example, a top-gate structure, a bottom-gate structure, or a dual-gate structure. In an example, the threshold compensation transistor T3 and the first reset transistor T6 which are directly connected to the gate of the drive transistor T1 are dual-gate thin film transistors, which helps reduce the leakage current of the gate of the drive transistor T1.

As shown in FIG. 14, the display panel further includes a pixel defining layer PDL and a photo spacer PS. The pixel defining layer PDL is provided with an opening OPN for defining the light-emitting area (light-exiting area, effective light-emitting area) of the pixel unit. The photo spacer PS is configured to support the fine metal mask when the light-emitting functional layer FL is formed.

The opening OPN is the light-exiting region of the pixel unit. The light-emitting functional layer FL is disposed on the first electrode E1 of the light-emitting element 100b, and the second electrode E2 of the light-emitting element 100b is disposed on the light-emitting functional layer FL. For example, the first electrode E1 is the anode of the light-emitting element 100b, and the second electrode E2 is the cathode of the light-emitting element 100b, which is not limited thereto.

An encapsulation layer CPS is disposed on the light-emitting element 100b. The encapsulation layer CPS includes a first encapsulation layer CPS1, a second encapsulation layer CPS2, and a third encapsulation layer CPS3. Exemplarily, the first encapsulation layer CPS1 and the third encapsulation layer CPS3 are inorganic material layers, and the second encapsulation layer CPS2 is an organic material layer.

For example, in the embodiments of the present disclosure, each pixel circuit 100a is provided with any one of the aforementioned shield electrodes SE. That is, both the first pixel circuit 10 of the first pixel unit 101 and the second pixel circuit 20 of the second pixel unit 102 are provided with any one of the aforementioned shield electrodes SE.

For example, the shield electrode SE includes an Al layer, a Mo layer, or an Al layer and a Ti layer that are alternately laminated. That is, the shield electrode SE is a single-layered metal layer structure, or is multi-layered metal layer structures that are alternately laminated.

For example, the first conductive layer LY1, the second conductive layer LY2, the third conductive layer LY3, and the fourth conductive layer LY4 are all made from a metal material. For example, the first conductive layer LY1 and the second conductive layer LY2 are made from a metal material, including but being not limited to, nickel, aluminum, and the like. For example, the third conductive layer LY3 and the fourth conductive layer LY4 are made from a material, including but being not limited to, titanium, aluminum, and the like. For example, the third conductive layer LY3 and the fourth conductive layer LY4 are both structures of three sub-layers of Ti/Al/Ti, which is not limited thereto. For example, the base substrate is a glass substrate or a polyimide substrate, which is not limited thereto, and the base substrate is selected based on needs. For example, the buffer layer BL, the isolation layer BR, the first insulating layer ISL1, the second insulating layer ISL2, the third insulating layer ISL3, the fourth insulating layer ISL4, the fifth insulating layer ISL5, and the sixth insulating layer ISL6 are all made from an insulating material. The materials of the first electrode E1 and the second electrode E2 of the light-emitting element are selected based on needs. In some embodiments, the first electrode E1 is made from, but not limited to, at least one of a transparent conductive metal oxide and argentum. For example, the transparent conductive metal oxide includes, but is not limited to, indium tin oxide (ITO). For example, the first electrode E1 adopts a laminated structure of three sub-layers of ITO/Ag/ITO. In some embodiments, the second electrode E2 is made from a metal with a low power function, including, but being not limited to, at least one of magnesium and argentum.

The embodiments of the present disclosure further provide a method for manufacturing a display panel. Referring to FIG. 2 to FIG. 14, the method is applicable for manufacturing the display panel provided in at least one of the embodiments of the present disclosure. The method is as follows.

(1) A buffer layer BL and an isolation layer BR are formed on a base substrate BS.
(2) A semiconductor thin film is formed on the isolation layer BR.
(3) The semiconductor thin film is patterned to form a semiconductor pattern layer.
(4) A first insulating layer ISL1 is formed on the semiconductor pattern layer.
(5) A first conductive thin film is formed on the first insulating layer ISL1, and the first conductive thin film is patterned to form a first conductive layer LY1.
(6) The semiconductor pattern layer is doped by using the first conductive layer LY1 as a mask to form an active layer LY0.
(7) A second insulating layer ISL2 is formed on the first conductive layer LY1.
(8) A second conductive thin film is formed on the second insulating layer ISL2, and the second conductive thin film is patterned to form a second conductive layer LY2.
(9) A third insulating layer ISL3 is formed on the second conductive layer LY2.
(10) At least one of the first insulating layer ISL1, the second insulating layer ISL2, and the third insulating layer ISL3 is patterned to form a via hole.
(11) A third conductive thin film is formed and the third conductive thin film is patterned to form a third conductive layer LY3. The various components in the third conductive layer LY3 are connected to the structures under the third conductive layer LY3 through via holes.
(12) A fourth insulating layer ISL4 and a fifth insulating layer ISL5 are formed, and the fourth insulating layer ISL4 and the fifth insulating layer ISL5 are patterned to form via holes.
(13) A fourth conductive thin film is formed and the fourth conductive thin film is patterned to form a fourth conductive layer LY4.
(14) A sixth insulating layer ISL6 and a transparent conductive layer are formed. The transparent conductive layer includes a conductive line L1.
(15) A first electrode E1 of a light-emitting element is formed.
(16) A pixel defining layer PDL and a photo spacer PS are formed.
(17) A light-emitting functional layer FL is formed.
(18) A second electrode E2 of the light-emitting element is formed.
(19) An encapsulation layer CPS is formed.

The embodiments of the present disclosure further provide a display device. The display device includes the display panel as shown in any one of FIG. 2 to FIG. 14.

Figure 15:
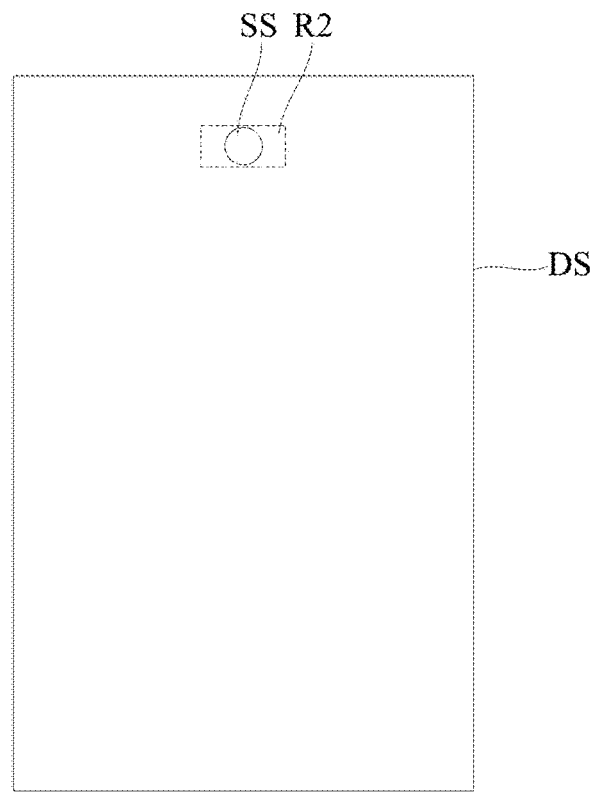
FIG. 15 is a schematic structural diagram of a display device according to some embodiments of the present disclosure.

As shown in FIG. 15, the display device includes a display panel DS and a photosensitive sensor SS, i.e., a camera. The photosensitive sensor SS is disposed on the back side of the display panel DS and is opposite to the second display region R2. The display panel DS includes a front face and a back face which are opposite, and the front face is generally for display.

For example, the display device is a full screen display device installed with an under-screen camera. For example, the display device includes an OLED or a product including an OLED. For example, the display device includes a television, a digital camera, a mobile phone, a watch, a tablet computer, a laptop, a navigator including the display panel described above, or any product or component with a display function.

Figure 16:
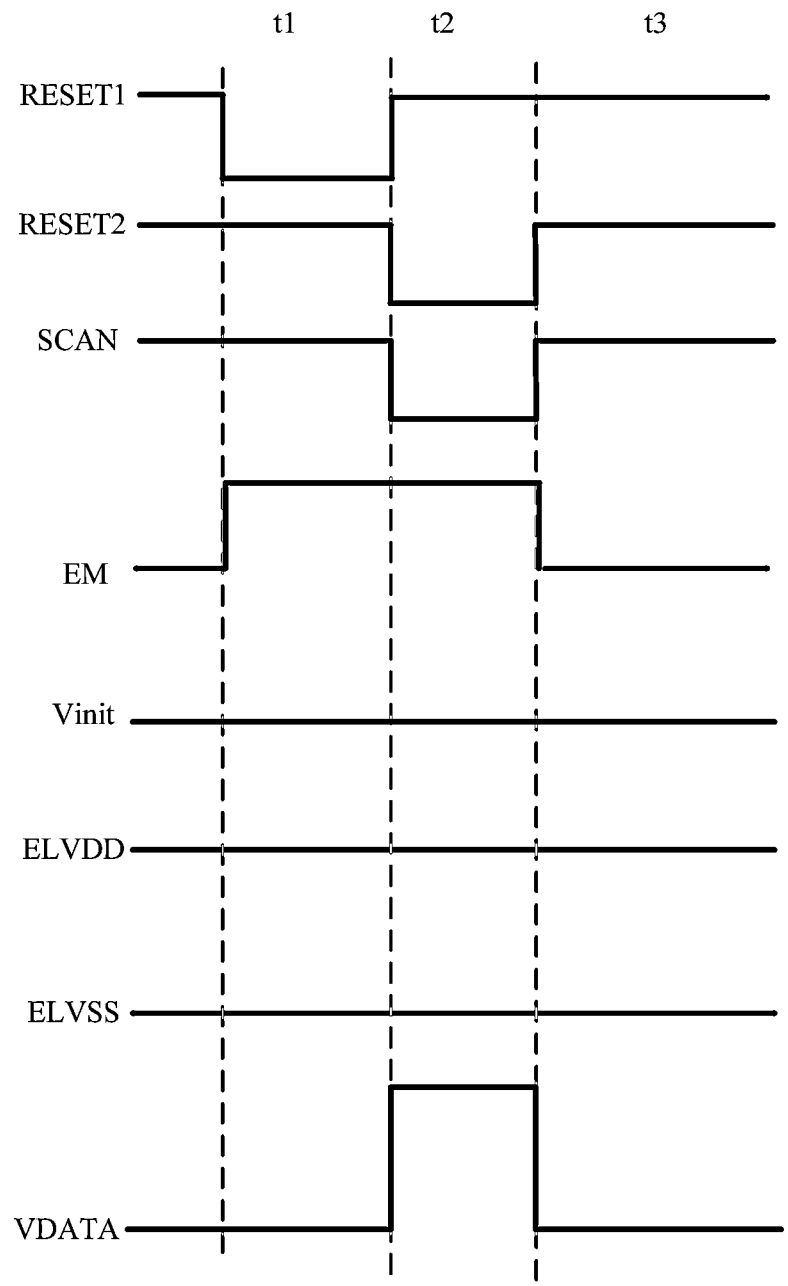
FIG. 16 is a working timing diagram of a pixel circuit.

FIG. 16 is a working timing diagram of a pixel circuit. As shown in FIG. 16, in the display period of one frame, the driving method of a pixel unit includes a first reset stage t1, a stage t2 of data writing, threshold compensation and second resetting, and a light-emitting stage t3. The gate of the drive transistor T1 is reset when the reset control signal RESET1 is at a low potential, and the first electrode E1 (e.g., anode) of the light-emitting element 100b is reset when the scan signal SCAN is at a low potential. For example, as shown in FIG. 16, when the scan signal SCAN is at a low potential, the data voltage VDATA is written in, and meanwhile the threshold voltage Vth of the drive transistor T1 is acquired, and the data voltage VDATA containing data information on the data line is stored in the storage capacitor Cst. When an electronic signal of the light-emitting control signal line EML is at a low potential, the light-emitting element 100b emits light, and the voltage of the first node N1 is maintained (the light-emitting stability of the light-emitting element 100b) due to the storage capacitor Cst. During the driving process of the pixel circuit 10, in the light-emitting stage, the storage capacitor is configured to maintain the voltage signal, to form a voltage between the gate and the source of the drive transistor, thereby controlling the drive transistor to form a driving current to drive the light-emitting element 100b to emit light.

As shown in FIG. 16, in the reset stage t1, the light-emitting control signal EM is set as a turn-off voltage, the reset control signal RESET1 is set as a turn-on voltage, the reset control signal RESET2 is set as a turn-off voltage, and the scan signal SCAN is set as a turn-off voltage.

As shown in FIG. 16, in stage t2 of data writing, threshold compensation and second resetting, the light-emitting control signal EM is set as a turn-off voltage, the reset control signal RESET1 is set as a turn-off voltage, the reset control signal RESET2 is set as a turn-on voltage, and the scan signal SCAN is set as a turn-on voltage.

As shown in FIG. 16, in light-emitting stage t3, the light-emitting control signal EM is set as a turn-on voltage, the reset control signal RESET1 is set as a turn-off voltage, the reset control signal RESET2 is set as a turn-off voltage, and the scan signal SCAN is set as a turn-off voltage.

As shown in FIG. 16, the first voltage signal ELVDD and the second voltage signal ELVSS are both constant voltage signals. For example, the potential of the initialization signal Vinit is between the potential of the first voltage signal ELVDD and the potential of the second voltage signal ELVSS.

For example, in the embodiments of the present disclosure, the turn-on voltage refers to a voltage turning on the first electrode and the second electrode of the corresponding transistor, and the turn-off voltage refers to a voltage turning off the first electrode and the second electrode of the corresponding transistor. When the transistor is a P-type transistor, the turn-on voltage is a low voltage (e.g., 0V), and the turn-off voltage is a high voltage (e.g., 5V); when the transistor is an N-type transistor, the turn-on voltage is a high voltage (e.g., 5V), and the turn-off voltage is a low voltage (e.g., 0V). The driving waveforms shown in FIG. 16 are illustrated by taking the P-type transistor as an example in which the turn-on voltage is a low voltage (e.g., 0V) and the turn-off voltage is a high voltage (e.g., 5V), which is not limited thereto.

In the first reset stage t1, the light-emitting control signal EM is the turn-off voltage, the reset control signal RESET1 is the turn-on voltage, the reset control signal RESET2 is the turn-off voltage, and the scan signal SCAN is the turn-off voltage. At this time, the first reset transistor T6 is turned on, while the second reset transistor T7, the data writing transistor T2, the threshold compensation transistor T3, the first light-emitting control transistor T4 and the second light-emitting control transistor T5 are turned off. The first reset transistor T6 transmits the first initialization signal Vinit1 (initialization voltage Vinit) to the gate of the drive transistor T1 and is stored in the storage capacitor Cst, to reset the drive transistor T1 and eliminate data stored at the previous time of (previous frame) light-emitting.

In the stage t2 of data writing, threshold compensation and second resetting, the light-emitting control signal EM is the turn-off voltage, the reset control signal RESET1 is the turn-off voltage, the reset control signal RESET2 is the turn-on voltage, and the scan signal SCAN is the turn-on voltage. At this time, the data writing transistor T2 and the threshold compensation transistor T3 are turned on, and the second reset transistor T7 is turned on. The second reset transistor T7 transmits the second initialization signal Vinit2 (initialization voltage Vinit) to the first electrode E1 of the light-emitting element 100b, to reset the light-emitting element 100b. The first light-emitting control transistor T4, the second light-emitting control transistor T5, and the first reset transistor T6 are turned off. At this time, the data writing transistor T2 transmits the data voltage VDATA to the first electrode of the drive transistor T1, that is, the data writing transistor T2 receives the scan signal SCAN and the data voltage VDATA and writes the data voltage VDATA to the first electrode T11 of the drive transistor T1 based on the scan signal SCAN. The threshold compensation transistor T3 is turned on to conduct the drive transistor T1 into a diode structure, thereby charging the gate T10 of the drive transistor T1. After charging is completed, the gate voltage of the drive transistor T1 is VDATA+Vth, wherein VDATA is the data voltage and Vth is the threshold voltage of the drive transistor T1. That is, the threshold compensation transistor T3 receives the scan signal SCAN and performs threshold voltage compensation on the gate voltage of the drive transistor T1 based on the scan signal SCAN. In this stage, the voltage difference between two ends of the storage capacitor Cst is ELVDD-VDATA-Vth.

In the light-emitting stage t3, the light-emitting control signal EM is the turn-on voltage, the reset control signal RESET1 is the turn-off voltage, the reset control signal RESET2 is the turn-off voltage, and the scan signal SCAN is the turn-off voltage. The first light-emitting control transistor T4 and the second light-emitting control transistor T5 are turned on, while the data writing transistor T2, the threshold compensation transistor T3, the first reset transistor T6, and the second reset transistor T7 are turned off. The first voltage signal ELVDD is transmitted through the first light-emitting control transistor T4 to the first electrode T10 of the drive transistor T1. The gate voltage of the drive transistor T1 maintains at VDATA+Vth, the light-emitting current I flows into the light-emitting element 100b through the first light-emitting control transistor T4, the drive transistor T1, and the second light-emitting control transistor T5, and the light-emitting element 100b emits light. That is, the first light-emitting control transistor T4 and the second light-emitting control transistor T5 receive the light-emitting control signal EM and control the light-emitting element 100b to emit light based on the light-emitting control signal EM.

For example, the proportion of the duration of the light-emitting stage t3 to the display period of one frame is adjustable. The luminance is controlled by adjusting the proportion of the duration of the light-emitting stage t3 to the display period of one frame. For example, the proportion of the duration of the light-emitting stage t3 to the display period of one frame is adjusted by controlling the scan driving circuit or a driving circuit additionally provided in the display panel.

In the embodiments of the present disclosure, the structures in the same layer are formed of the same film layer through the same patterning process. For example, the structures in the same layer are disposed on the surface, away from the base substrate, of the same structure.

It should be noted that the thicknesses of the layers or regions are scaled up in the drawings used to describe the embodiments of the present disclosure in order to clearly show the structures, and the proportion between the various dimensions is merely illustrative and does not represent actual proportional relationship. It will be appreciated that when a structure such as a layer, film, region or substrate is referred to as being "on" or "under" another structure, it may be "directly on" or "directly under" the other structure or an intervening structure may exist.

In the embodiments of the present disclosure, the patterning or patterning process may include a photoetching process only, or may include a photoetching process and an etching process, or may include printing, ink jetting and other processes for forming a predetermined pattern. The photoetching process includes film forming, exposure, development, and the like for forming a pattern by using photoresist, a mask, an exposure machine, or the like. The corresponding patterning process may be selected according to the structure formed in the embodiments of the present disclosure.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A display panel, comprising:
 a base substrate;
 a plurality of pixel units disposed on the base substrate, wherein the pixel unit comprises a pixel circuit and a light-emitting element, the pixel circuit being configured to drive the light-emitting element;
 a constant voltage line, configured to provide a constant voltage to the pixel circuit; and
 a plurality of shield electrodes, wherein at least one of the plurality of shield electrodes corresponds to at least one pixel circuit, an orthographic projection of the at least one of the plurality of shield electrodes on the base substrate is at least partially overlapped with an orthographic projection of the corresponding at least one pixel circuit on the base substrate, at least part of the plurality of shield electrodes are connected, the at least part of the plurality of shield electrodes which are connected are electrically connected to the constant voltage line, and in a direction perpendicular to the base substrate, the shield electrode is disposed between a conductive line and the pixel circuit, the conductive line being configured to connect a pixel circuit and a light-emitting element that are in different display regions, wherein the at least part of the plurality of shield electrodes are connected by a connecting portion, wherein the connecting portion comprises a third connecting portion connected between at least two of the plurality of shield electrodes that are arranged in a third direction, and the at least two of the plurality of shield electrodes are connected in a misaligned manner by the third connecting portion, wherein the third direction intersects the first direction and the second direction, and is parallel to the base substrate; and wherein the base substrate is provided with a first display region and a second display region, the first display region being on at least one side of the second display region, wherein the first display region comprises a main display region and an auxiliary display region, wherein the main display region is on at least one side of the auxiliary display region, and the auxiliary display region is adjacent to the second display region; and the plurality of shield electrodes that are connected are disposed in both the main display region and the auxiliary display region, only one of the plurality of shield electrodes that are connected in the main display region is connected to the constant voltage line through a first via hole, and shield electrodes in the auxiliary display region are not connected to the constant voltage line.

2. The display panel according to claim 1, wherein the plurality of shield electrodes comprise a plurality of groups of shield electrodes, wherein each group of the plurality of groups of shield electrodes is extended in a first direction, and the plurality of groups of shield electrodes are arranged in a second direction, the first direction intersecting the second direction, and both the first direction and the second direction being parallel to the base substrate.

3. The display panel according to claim 1, wherein the first direction is an extension direction of the constant voltage line.

4. The display panel according to claim 1, wherein
the pixel unit comprises a first pixel unit and a second pixel unit, wherein
the first pixel unit is disposed in the first display region; and
the pixel circuit of the second pixel unit is disposed in the first display region, the light-emitting element of the second pixel unit is disposed in the second display region, and the pixel circuit and the light-emitting element of the second pixel unit are connected by the conductive line.

5. The display panel according to claim 4, wherein the pixel circuit of the second pixel unit is disposed in the auxiliary display region.

6. The display panel according to claim 1, further comprising: a first power line, a first initialization signal line and a reset control signal line; wherein the pixel circuit comprises a drive transistor, a first gate signal line, a second gate signal line, a first reset transistor, and a storage capacitor; wherein a first electrode of the drive transistor is connected to the first power line, a gate of the drive transistor is connected to the first gate signal line, the first gate signal line is connected to the second gate signal line, the second gate signal line is connected to a second electrode of the first reset transistor, a first electrode of the first reset transistor is connected to the first initialization signal line, and a gate of the first reset transistor is connected to the reset control signal line; and a first electrode of the storage capacitor is connected to the gate of the drive transistor, and a second electrode of the storage capacitor is connected to the first power line.

7. The display panel according to claim 6, wherein in the second direction, the second electrodes of the storage capacitors of adjacent pixel circuits are connected with each other, at least two of the shield electrodes arranged in the second direction are connected by the second connecting portion, and an orthographic projection of the second connecting portion on the base substrate is at least partially overlapped with an orthographic projection of a connecting portion between the connected second electrodes on the base substrate; or in the second direction, the second electrodes of the storage capacitors of adjacent pixel circuits are spaced apart.

8. The display panel according to claim 7, wherein the constant voltage line comprises the first power line or the first initialization signal line.

9. The display panel according to claim 6, wherein an orthographic projection of at least one of following structures on the base substrate is at least partially within an orthographic projection of the shield electrode on the base substrate:

the gate of the drive transistor;
the first gate signal line;
the second gate signal line;
the second electrode of the first reset transistor; and
a connecting portion between the second electrode of the storage capacitor and the first power line.

10. The display panel according to claim 6, further comprising: a gate line and a data line; wherein the pixel circuit further comprises a data writing transistor; wherein a gate of the data writing transistor is connected to the gate line, a first electrode of the data writing transistor is connected to the data line, and a second electrode of the data writing transistor is connected to the first electrode of the drive transistor.

11. The display panel according to claim 10, wherein the pixel circuit further comprises a threshold compensation transistor and a block; wherein a first electrode of the threshold compensation transistor is connected to the second electrode of the drive transistor, and a second electrode of the threshold compensation transistor is connected to the second gate signal line, and a gate of the threshold compensation transistor is connected to the gate line;
the threshold compensation transistor comprises a first channel and a second channel, the first channel and the second channel being connected by a conductive connecting portion; and
the block is connected to the first power line, and an orthographic projection of the block on the base substrate is at least partially overlapped with an orthographic projection of the conductive connecting portion on the base substrate.

12. The display panel according to claim 11, wherein the block is connected to the first power line through a second via hole, wherein an orthographic projection of the second via hole on the base substrate is at least partially within an orthographic projection of the shield electrode on the base substrate.

13. The display panel according to claim 11, wherein the orthographic projection of the block on the base substrate is partially overlapped with an orthographic projection of the second gate signal line on the base substrate.

14. The display panel according to claim 6, further comprising: a light-emitting control signal line, wherein the pixel circuit further comprises a first light-emitting control transistor and a second light-emitting control transistor; wherein a gate of the first light-emitting control transistor is connected to the light-emitting control signal line, a first electrode of the first light-emitting control transistor is connected to the first power line, and a second electrode of the first light-emitting control transistor is connected to the first electrode of the drive transistor; and a gate of the second light-emitting control transistor is connected to the light-emitting control signal line, a first electrode of the second light-emitting control transistor is connected to the second electrode of the drive transistor, and a second electrode of the second light-emitting control transistor is connected to the light-emitting element.

15. The display panel according to claim 14, further comprising: a second initialization signal line, wherein the pixel circuit further comprises a second reset transistor; wherein a gate of the second reset transistor is connected to the reset control signal line, a first electrode of the second reset transistor is connected to the second initialization signal line, and a second electrode of the second reset transistor is connected to the second electrode of the second light-emitting control transistor.

16. The display panel according to claim 1, wherein the shield electrode comprises an Al layer, a Mo layer, or an Al layer and a Ti layer that are alternately laminated.

17. A display device, comprising a display panel, wherein the display panel comprises:

a base substrate;

a plurality of pixel units disposed on the base substrate, wherein the pixel unit comprises a pixel circuit and a light-emitting element, the pixel circuit being configured to drive the light-emitting element;

a constant voltage line, configured to provide a constant voltage to the pixel circuit; and a plurality of shield electrodes, wherein at least one of the plurality of shield electrodes corresponds to at least one pixel circuit, an orthographic projection of the at least one of the plurality of shield electrodes on the base substrate is at least partially overlapped with an orthographic projection of the corresponding at least one pixel circuit on the base substrate, at least part of the plurality of shield electrodes are connected, the at least part of the plurality of shield electrodes which are connected are electrically connected to the constant voltage line, and in a direction perpendicular to the base substrate, the shield electrode is disposed between a conductive line and the pixel circuit, the conductive line being configured to connect a pixel circuit and a light-emitting element that are in different display regions, wherein the at least part of the plurality of shield electrodes are connected by a connecting portion, wherein the connecting portion comprises a third connecting portion connected between at least two of the plurality of shield electrodes that are arranged in a third direction, and the at least two of the plurality of shield electrodes are connected in a misaligned manner by the third connecting portion, wherein the third direction intersects the first direction and the second direction, and is parallel to the base substrate; and wherein the base substrate is provided with a first display region and a second display region, the first display region being on at least one side of the second display region, wherein the first display region comprises a main display region and an auxiliary display region, wherein the main display region is on at least one side of the auxiliary display region, and the auxiliary display region is adjacent to the second display region; and the plurality of shield electrodes that are connected are disposed in both the main display region and the auxiliary display region, only one of the plurality of shield electrodes that are connected in the main display region is connected to the constant voltage line through a first via hole, and shield electrodes in the auxiliary display region are not connected to the constant voltage line.

18. The display device according to claim 17, wherein the plurality of shield electrodes comprise a plurality of groups of shield electrodes, wherein each group of the plurality of groups of shield electrodes is extended in a first direction, and the plurality of groups of shield electrodes are arranged in a second direction, the first direction intersecting the second direction, and both the first direction and the second direction being parallel to the base substrate.

* * * * *